(12) United States Patent
Hirano

(10) Patent No.: US 11,054,741 B2
(45) Date of Patent: Jul. 6, 2021

(54) IMPRINT APPARATUS AND METHOD OF MANUFACTURING ARTICLE

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 210 days.

(21) Appl. No.: 16/131,139

(22) Filed: Sep. 14, 2018

(65) Prior Publication Data

US 2019/0086797 A1    Mar. 21, 2019

(30) Foreign Application Priority Data

Sep. 19, 2017    (JP) .............................. JP2017-179006

(51) Int. Cl.
  *G03F 7/00*     (2006.01)
  *B29C 35/08*    (2006.01)
  *B29C 59/02*    (2006.01)

(52) U.S. Cl.
  CPC ............ *G03F 7/0002* (2013.01); *B29C 35/08* (2013.01); *B29C 59/02* (2013.01); *B29C 2035/0827* (2013.01)

(58) Field of Classification Search
  CPC ....... G03F 7/0002; B29C 59/02; B29C 35/08; B29C 2035/0827
  See application file for complete search history.

(56) References Cited

U.S. PATENT DOCUMENTS

| 7,862,761 B2 | 1/2011 | Okushima et al. |
| 8,142,850 B2 | 3/2012 | Sreenivasan et al. |
| 8,973,494 B2 | 3/2015 | Hatano et al. |
| 2004/0021866 A1* | 2/2004 | Watts .................. B29C 35/0888 356/401 |
| 2015/0014877 A1* | 1/2015 | Yamashita ............ G03F 7/0002 264/40.1 |
| 2016/0096313 A1* | 4/2016 | Usui ..................... G03F 7/0002 264/40.1 |
| 2018/0151418 A1* | 5/2018 | Mitra ................ H01L 21/76817 |

(Continued)

FOREIGN PATENT DOCUMENTS

| JP | 2009532906 A | 9/2009 |
| JP | 2011161711 A | 8/2011 |
| JP | 4819577 B2 | 11/2011 |

(Continued)

OTHER PUBLICATIONS

Office Action issued in Korean Appln. No. 10-2018-0111300 dated Nov. 2, 2020.

*Primary Examiner* — Nahida Sultana

(74) *Attorney, Agent, or Firm* — Rossi, Kimms & McDowell LLP

(57) ABSTRACT

An imprint apparatus performs an imprint process by bringing a mold into contact with an imprint material arranged on a shot region of a substrate and curing the imprint material. The apparatus includes a controller configured to execute, in a case where an elapsed time from the supplying of the imprint material to the shot region until the contact with the mold falls outside an allowable range of a predetermined elapsed time, adjustment processing of adjusting an amount of the imprint material on the shot region at the timing of the contact.

11 Claims, 20 Drawing Sheets

(56) References Cited

U.S. PATENT DOCUMENTS

2019/0187575 A1* 6/2019 Lu .................... G03F 9/7088
2019/0217516 A1* 7/2019 Iwasaki ............... B29C 45/844

FOREIGN PATENT DOCUMENTS

| JP | 2014064022 A | 4/2014 |
| JP | 2016119417 A | 6/2016 |
| JP | 2016157845 A | 9/2016 |
| WO | 2007120537 A2 | 10/2007 |

* cited by examiner

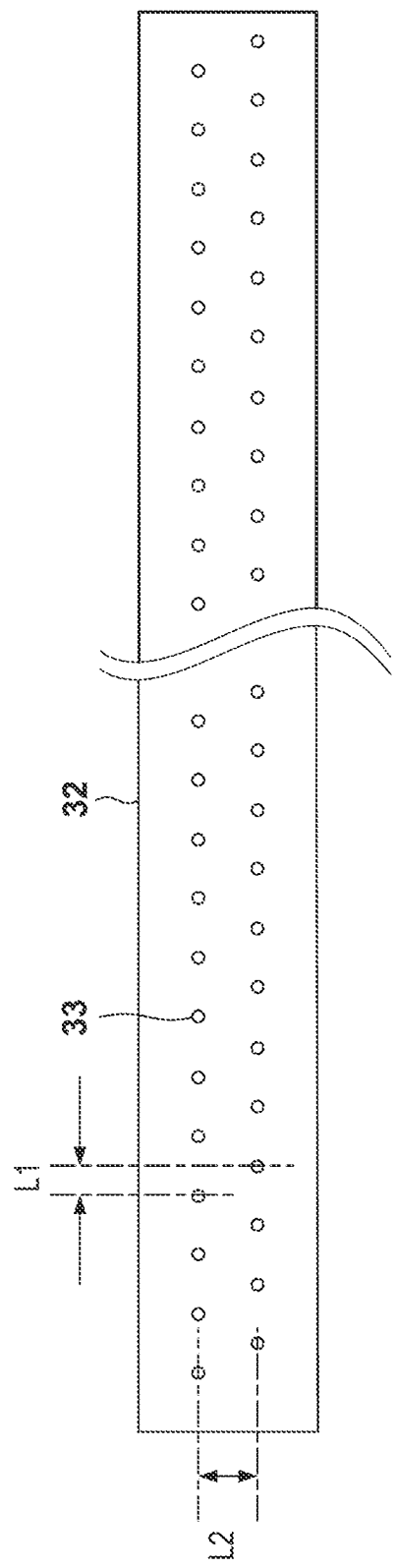

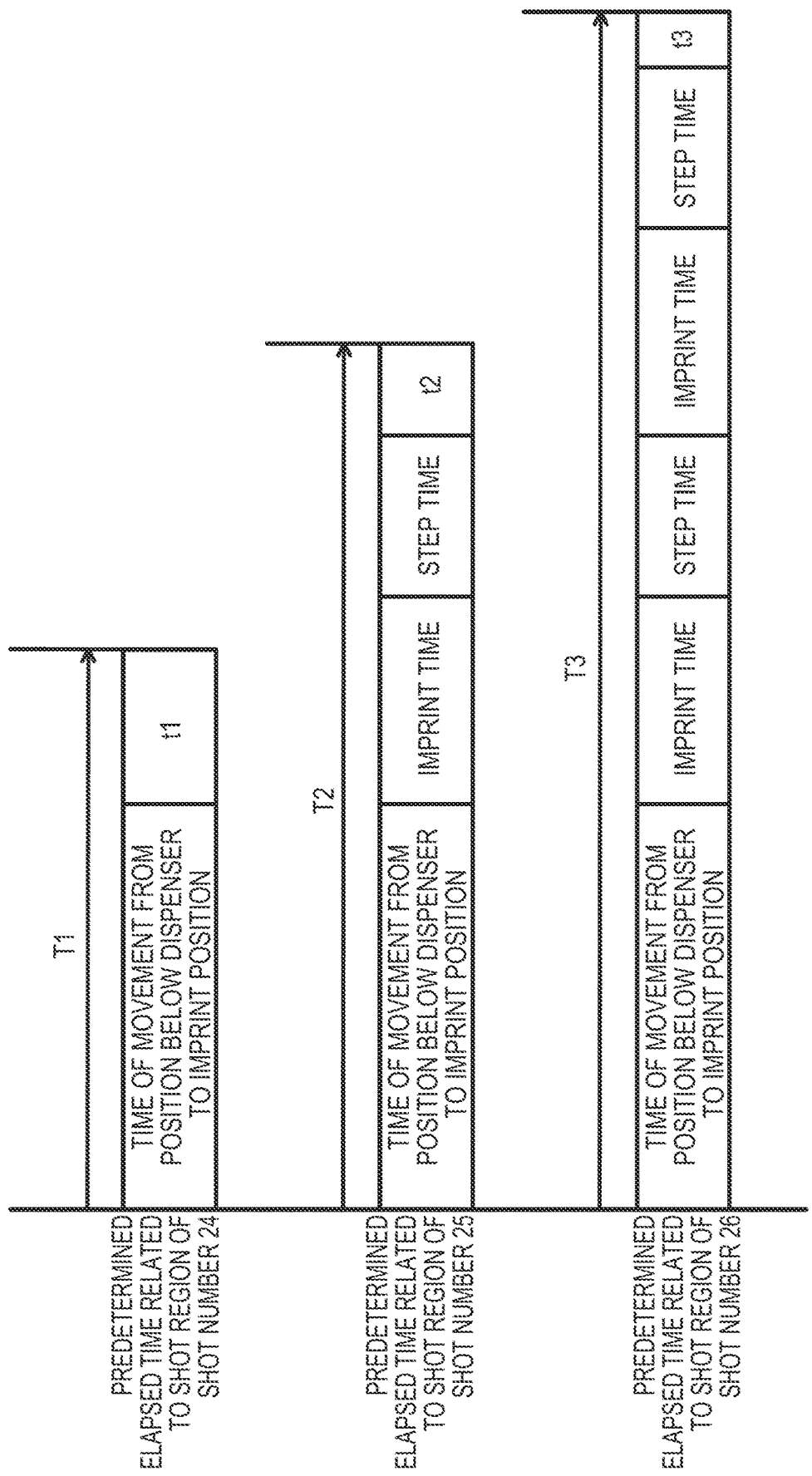

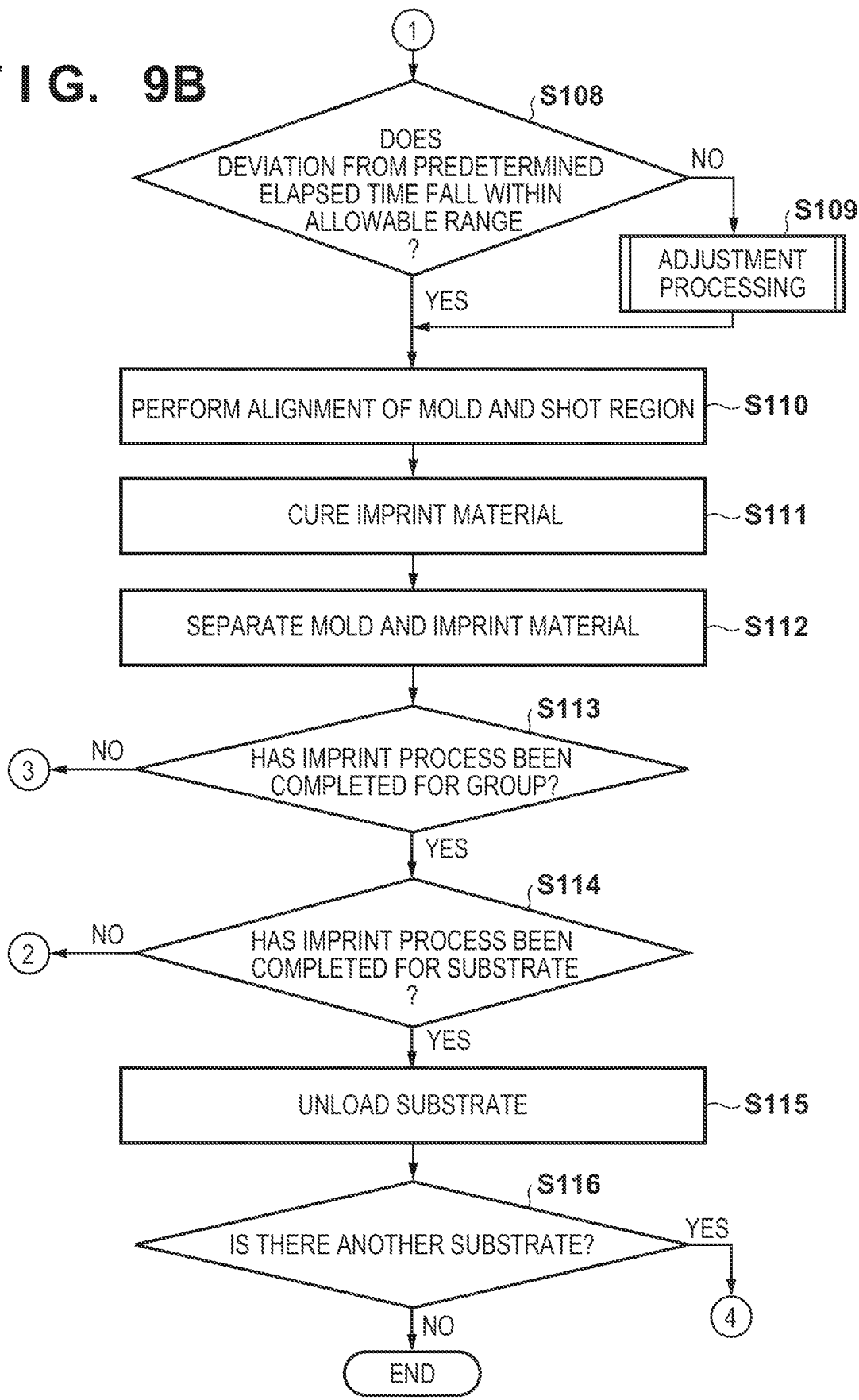

FIG. 12

| SHOT# | DropRecipe File | Evapo Ratio | EvapoAmount DRF | EvapoAmount Machine | DiffAmount |
|---|---|---|---|---|---|
| 1 | A | 0.9986 | 0.00077 | 0.00078 | -0.00001 |
| 2 | B | 0.9981 | 0.001045 | 0.001055 | -0.00001 |
| 3 | A | 0.9986 | 0.00077 | 0.00078 | -0.00001 |
| 4 | B | 0.9981 | 0.001045 | 0.001055 | -0.00001 |
| 5 | A | 0.9986 | 0.00077 | 0.00078 | -0.00001 |
| 6 | B | 0.9981 | 0.001045 | 0.001055 | -0.00001 |
| 7 | C | 0.9976 | 0.00132 | 0.00133 | -0.00001 |
| 8 | A | 0.9986 | 0.00077 | 0.00078 | -0.00001 |
| 9 | B | 0.9981 | 0.001045 | 0.001055 | -0.00001 |
| 10 | C | 0.9976 | 0.00132 | 0.00133 | -0.00001 |
| 11 | A | 0.9986 | 0.00077 | 0.00078 | -0.00001 |
| 12 | B | 0.9981 | 0.001045 | 0.001055 | -0.00001 |
| 13 | C | 0.9976 | 0.00132 | 0.00133 | -0.00001 |
| 14 | A | 0.9986 | 0.00077 | 0.00078 | -0.00001 |
| 15 | B | 0.9981 | 0.001045 | 0.001055 | -0.00001 |
| 16 | C | 0.9976 | 0.00132 | 0.00133 | -0.00001 |
| 17 | A | 0.9986 | 0.00077 | 0.00078 | -0.00001 |
| 18 | B | 0.9981 | 0.001045 | 0.001055 | -0.00001 |
| 19 | A | 0.9986 | 0.00077 | 0.00078 | -0.00001 |
| 20 | B | 0.9981 | 0.001045 | 0.001055 | -0.00001 |
| 21 | A | 0.9986 | 0.00077 | 0.00078 | -0.00001 |
| 22 | B | 0.9981 | 0.001045 | 0.001055 | -0.00001 |
| 23 | C | 0.9976 | 0.00132 | 0.00133 | -0.00001 |
| 24 | A | 0.9986 | 0.00077 | 0.00078 | -0.00001 |
| 25 | B | 0.9981 | 0.001045 | 0.001055 | -0.00001 |
| 26 | C | 0.9976 | 0.00132 | 0.00133 | -0.00001 |
| 27 | A | 0.9986 | 0.00077 | 0.00078 | -0.00001 |
| 28 | B | 0.9981 | 0.001045 | 0.001055 | -0.00001 |
| 29 | C | 0.9976 | 0.00132 | 0.00133 | -0.00001 |
| 30 | A | 0.9986 | 0.00077 | 0.00078 | -0.00001 |
| 31 | B | 0.9981 | 0.001045 | 0.001055 | -0.00001 |
| 32 | C | 0.9976 | 0.00132 | 0.00133 | -0.00001 |
| 33 | A | 0.9986 | 0.00077 | 0.00078 | -0.00001 |
| 34 | B | 0.9981 | 0.001045 | 0.001055 | -0.00001 |
| 35 | A | 0.9986 | 0.00077 | 0.00078 | -0.00001 |
| 36 | B | 0.9981 | 0.001045 | 0.001055 | -0.00001 |

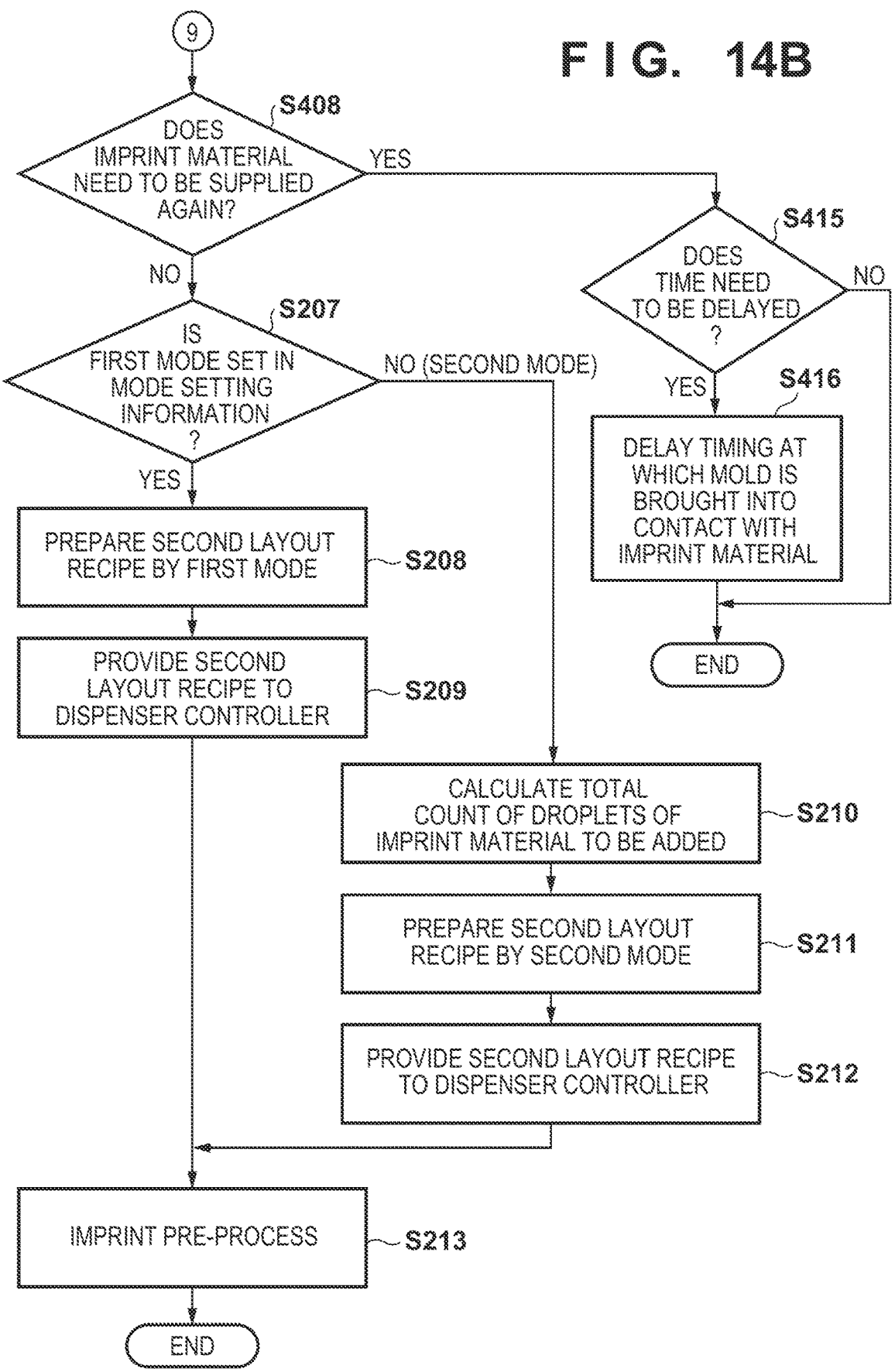

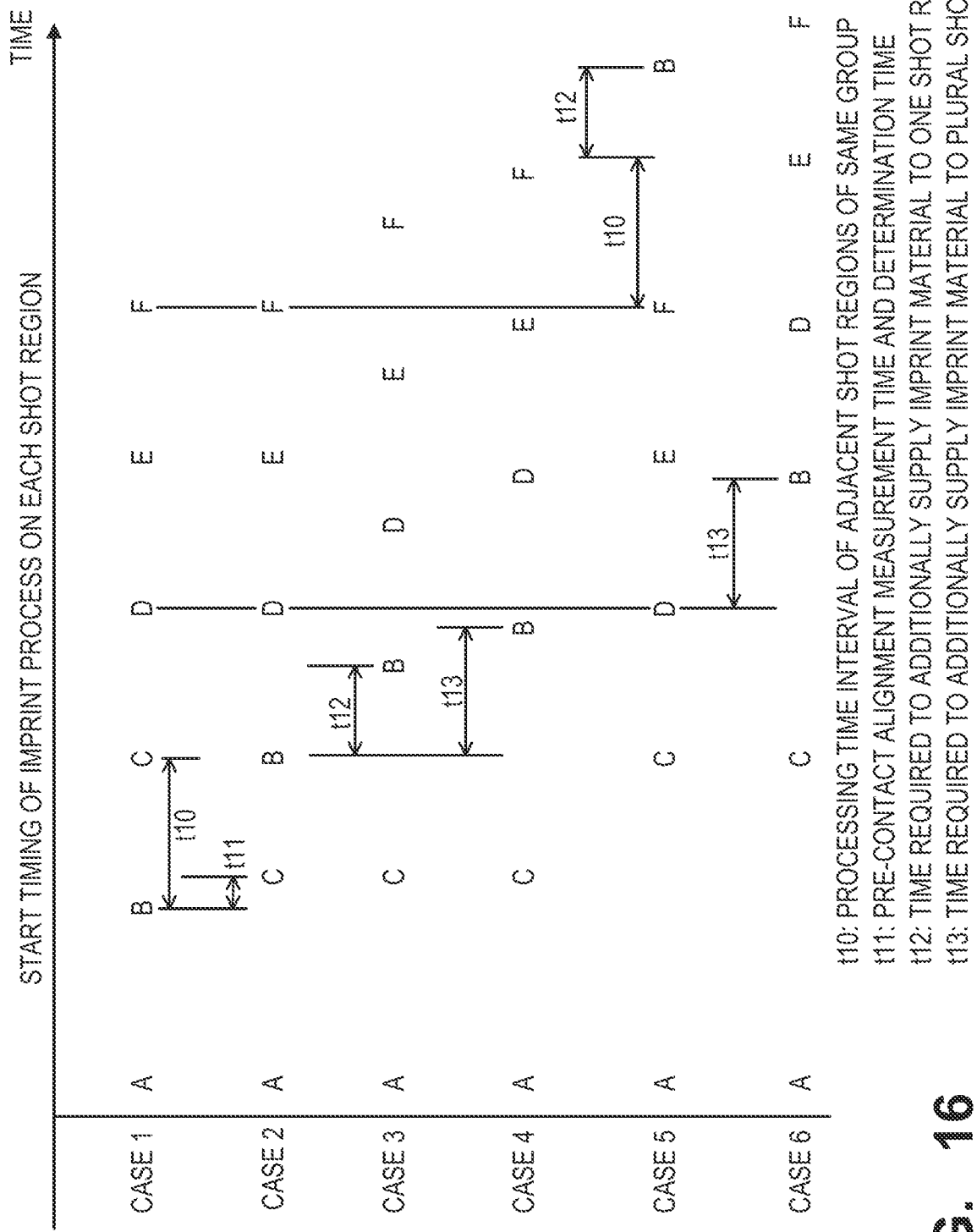

ns and a method of manufacturing an article.

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique of forming, on a substrate, a pattern made from a cured imprint material by arranging the imprint material on the substrate and curing the imprint material upon bringing a mold into contact with the imprint material. Since the imprint material has volatility, the amount of the imprint material can decrease during the period in which the imprint material is arranged on the substrate until the mold is brought into contact with the imprint material. If the mold is brought into contact with the imprint material in a state in which the amount of the imprint material on the substrate does not satisfy an appropriate amount due to the evaporation of the imprint material, a defective pattern may be formed on the substrate.

Japanese Patent Laid-Open No. 2009-532906 discloses a method of performing patterning by dividing and arranging a polymer material (imprint material) in a plurality of fields and bringing the mold into contact with the polymer material in each of the fields. In this method, after patterning is performed on a first subset of the plurality of fields, patterning is performed on a second subset of the plurality of fields. The volume of the polymer material distributed on the second subset of fields is set larger than the volume of the polymer material distributed on the first subset of fields. In Japanese Patent No. 4819577, when an uncured resin (imprint material) is to be arranged on a substrate, the layout interval of the imprint material is adjusted based on the evaporation amount of the resin.

Even when the imprint material is arranged with consideration to the evaporation of the imprint material, if the time taken from the arrangement of the imprint material onto the substrate until the contact with the mold falls outside a predetermined range of time, the imprint material can become excessive or deficient. This can create a defect in the pattern formed on the substrate. Alternatively, the imprint material may also become excessive or deficient in a case in which the information for controlling the supplying of the imprint material onto the substrate is set incorrectly. Neither Japanese Patent Laid-Open No. 2009-532906 nor Japanese Patent No. 4819577 considers these situations.

SUMMARY OF THE INVENTION

The present invention provides a technique advantageous in reducing the generation of a defect due to excess or deficiency of an imprint material.

One of aspects of the present invention provides an imprint apparatus that performs an imprint process by bringing a mold into contact with an imprint material arranged on a shot region of a substrate and curing the imprint material, the apparatus comprising: a controller configured to execute, in a case where an elapsed time from the supplying of the imprint material to the shot region until the contact with the mold falls outside an allowable range of a predetermined elapsed time, adjustment processing of adjusting an amount of the imprint material on the shot region at the timing of the contact.

Further features of the present invention will become apparent from the following description of exemplary embodiments with reference to the attached drawings.

BRIEF DESCRIPTION OF THE DRAWINGS

FIG. 3 is a view showing an example of the arrangement of a discharge head of a dispenser;

FIG. 5 is a view showing an example of a layout recipe;

FIG. 8 is a view showing an example of a calculation method of a predetermined elapsed time;

FIGS. 9A and 9B show a flowchart showing an example of the operation of the imprint apparatus;

FIG. 12 is a view showing an example of a management table;

FIGS. 14A and 14B show a flowchart showing an example of the operation of the imprint apparatus according to the second embodiment;

FIG. 16 is a view showing an example of a method for changing the processing order (sequence) of a plurality of shot regions which form a group.

DESCRIPTION OF THE EMBODIMENTS

Exemplary embodiments will be described hereinafter with reference to the accompanying drawings.

Figure 1:
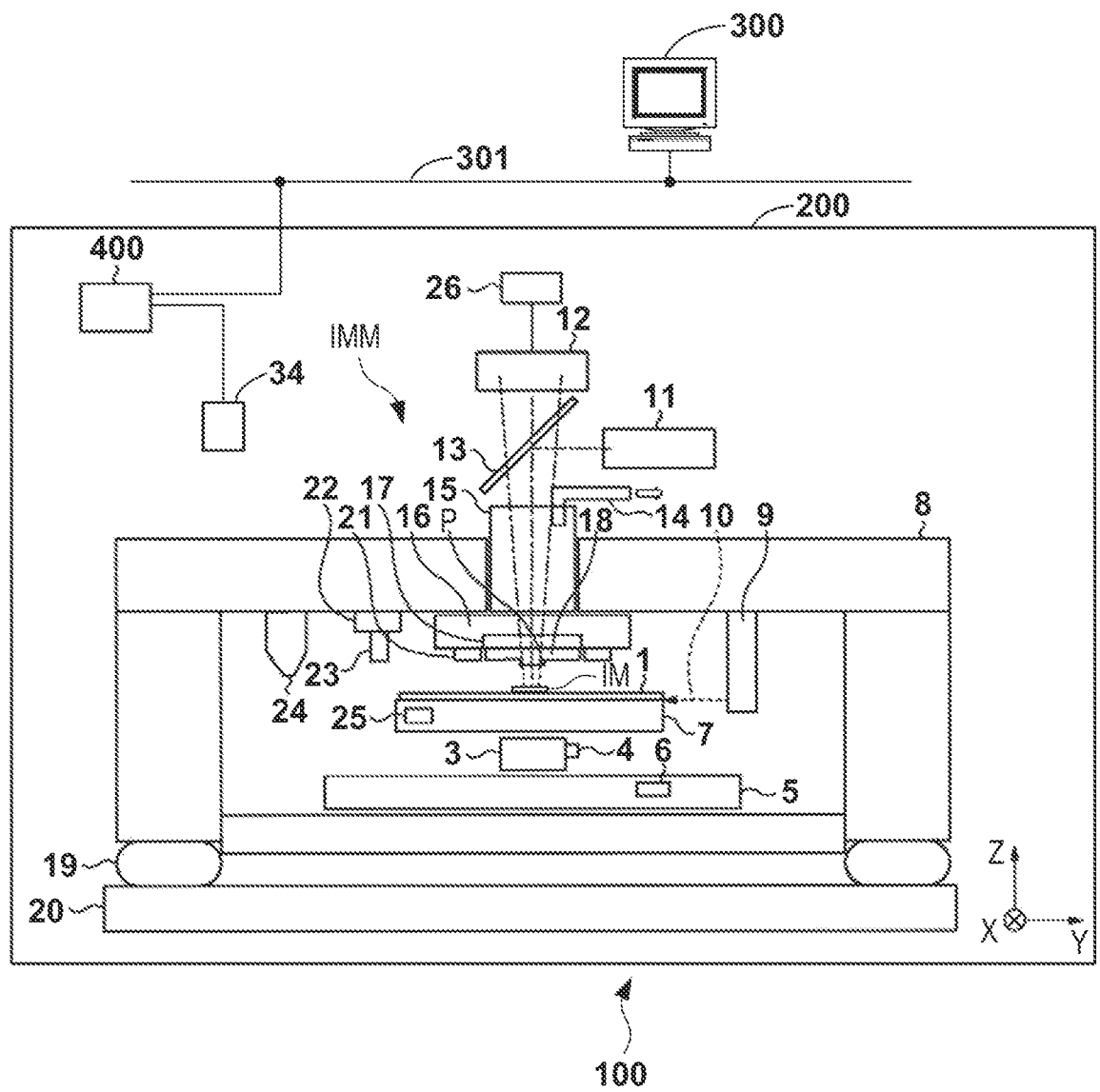
FIG. 1 is a view showing the arrangement of an imprint apparatus according to an embodiment of the present invention.

FIG. 1 shows the arrangement of an imprint apparatus 100 according to an embodiment of the present invention. The imprint apparatus 100 performs an imprint process of bringing a pattern surface P of a mold 18 into contact with an imprint material arranged on a shot region of a substrate 1 and curing the imprint material.

A curable composition (may also be referred to as an uncured resin) which is cured by receiving curing energy is used for the imprint material. An electromagnetic wave, heat, or the like can be used as the curing energy. For example, light such as infrared light, visible rays, ultraviolet light, or the like whose wavelength is selected from a range of 10 nm (inclusive) to 1 mm (inclusive) can be used as the electromagnetic wave. The curable composition can be a composition that is cured by light irradiation or application of heat. Out of these, a photo-curable composition that is cured by light irradiation contains at least a polymerizable compound and a photopolymerization initiator, and may further contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like. The imprint material can be arranged on a substrate in a droplet-like shape, or an island-like shape or a film-like shape formed by a plurality of droplets which are connected to each other. The viscosity (viscosity at 25° C.) of the imprint material can be set at, for example, 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

In this specification and the accompanying drawings, directions are shown in an X-Y-Z coordinate system in which a direction parallel to the surface of the substrate 1 forms an X-Y plane. Let an X direction, a Y direction, and a Z direction be the directions parallel to an X-axis, a Y-axis, and a Z-axis, respectively, in the X-Y-Z coordinate system. Let θX, θY, and θZ be rotation about the X-axis, rotation about the Y-axis, and rotation about the Z-axis, respectively. Control or driving with regard to the X-axis, the Y-axis, and the Z-axis means control or driving with regard to the direction parallel to the X-axis, the direction parallel to the Y-axis, and the direction parallel to the Z-axis, respectively. Further, control or driving with regard to a θX-axis, a θY-axis, and a θZ-axis means control or driving with regard to rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by values on the θX-axis, the θY-axis, and the θZ-axis. Alignment means controlling the position and/or attitude. Alignment can include the control of the position and/or attitude of at least one of the substrate and the mold.

The imprint apparatus 100 can include a chamber 200 for preventing the entry of a foreign substance and maintaining a constant temperature and humidity in an environment for supplying an imprint material onto a substrate 1 and performing an imprint process. The imprint apparatus 100 includes a measurement device 4, a measurement device 6, a substrate stage 7, a bridge structure 8, a measurement device 9, a curing device 11, an alignment measurement device 12, a half mirror 13, an exhaust duct 14, a connecting member 15, and an imprint head 16. The imprint apparatus 100 further includes gas springs 19, a base surface plate 20, a gas supply 21, a holder 22, an imprint material supply (dispenser) 23, an off-axis scope 24, a pressure sensor 25, a detector 26, a controller 400, and a user interface 34. The controller 400 is connected to an integrated computer 300 via a network 301. The imprint head 16 includes a mold chuck 17 that holds the mold 18 having the pattern surface P. A three-dimensional pattern corresponding to a pattern to be formed on the substrate 1 is formed on the pattern surface P of the mold 18.

The detector 26 can perform image capturing to monitor the contact state of the mold 18 with respect to the imprint material on the substrate 1, the filling state of the pattern surface P of the mold 18 with the imprint material, and the separation state of the mold 18 from the cured imprint material. The detector 26 can also observe the positional relationship between the periphery of the substrate 1 and a substrate chuck by moving the substrate stage 7. The mold chuck 17 can hold the mold 18 by, for example, vacuum suction. The mold chuck 17 can have a structure that prevents the mold 18 from dropping off from the mold chuck 17. The imprint head 16 can be formed so as to be capable of driving the mold 18 with respect to at least three axes of Z, θX, and θY, or more preferably, six axes of X, Y, Z, θX, θY, and θZ with reference to the bridge structure 8. The imprint head 16 is connected to the bridge structure 8 and supported by the bridge structure 8 via the connecting member 15. The alignment measurement device 12 is also supported by the bridge structure 8.

The alignment measurement device 12 performs alignment measurement for alignment between the mold 18 and the substrate 1. The alignment measurement device 12 includes an alignment detection system for generating an alignment signal by detecting a mark provided on the mold 18 and a mark provided on the substrate stage 7 and the substrate 1. Furthermore, the alignment measurement device 12 may include a camera and have, similarly to the detector 26, a function of observing the cured state of the imprint material on the substrate 1 resulting from the irradiation of the imprint material with curing energy. The alignment measurement device 12 may be capable of observing not only the cured state of the imprint material on the substrate but also the contact state of the mold 18 with respect to the imprint material on the substrate, the filling state of the mold 18 with the imprint material, and the separation state of the mold 18 from the cured imprint material. The half mirror 13 is arranged above the connecting member 15. The curing energy from the curing device 11 is reflected by the half mirror 13 and transmitted through the mold 18, thereby irradiating the imprint material on the substrate 1. The imprint material on the substrate 1 is cured by irradiation with the curing energy form the curing device 11.

The bridge structure 8 is supported by the base surface plate 20 via the gas springs 19 for insulating a vibration from the floor. Each gas spring 19 can have a structure generally adopted as an active anti-vibration function in an exposure apparatus. For example, each gas spring 19 includes an XYZ relative position measurement sensor, an XYZ driving linear motor, a servo valve for controlling the amount of air in the gas spring, and the like which are provided in the bridge structure 8 and the base surface plate 20. The dispenser (imprint material supply) 23, which includes a nozzle for supplying (applying) the imprint material to the substrate 1 and a controller for controlling the timing and amount of the supply, is attached to the bridge structure 8 via the holder 22. The imprint material can be arranged (supplied) onto each arbitrary position on the substrate 1 by causing the dispenser 23 to discharge the imprint material while moving the substrate stage 7 (that is, the substrate 1). The substrate 1 can have, for example, a circular shape. A plurality of shot regions can be arranged on the substrate 1. Although each shot region can have a dimension of, for example, 33 mm×26 mm, it may have another dimension. Each shot region can include a plurality of chip regions separated by scribe lines.

In an imprint process executed by the imprint apparatus 100, a layer can remain in the concave portion of the three-dimensional pattern formed on the surface of the substrate 1. This layer will be referred to as a residual layer.

The residual layer can be removed by etching. The thickness of the residual layer will be referred to as an RLT (residual layer thickness). If no layer with a thickness corresponding to the required RLT is formed in a shot region, the substrate 1 is unwantedly hollowed out by etching.

The substrate stage 7 has a substrate chuck and holds the substrate 1 by the substrate chuck. The substrate stage 7 which holds the substrate 1 can be driven with respect to six axes of X, Y, Z, θX, θY, and θZ. The substrate stage 7 can be supported by, for example, the bridge structure 8 via an X slider 3 including an X-direction moving mechanism and a Y slider 5 including a Y-direction moving mechanism. The X slider 3 can include the measurement device 4 for measuring the relative positions of the X slider 3 and Y slider 5. The Y slider 5 can include the measurement device 6 for measuring the relative positions of the Y slider 5 and bridge structure 8. The measurement devices 4 and 6 can measure the position of the substrate stage 7 with reference to the bridge structure 8. Each of the measurement devices 4 and 6 can be formed by, for example, an encoder (linear encoder).

The distance in the Z direction between the substrate stage 7 and the bridge structure 8 is determined by the bridge structure 8, the X slider 3, and the Y slider 5. It is possible to suppress the variation in the imprint operation in the Z direction of the substrate stage 7 and the bridge structure 8 to a variation of several tens of nm by maintaining rigidities in the Z and tilt directions of the X slider 3 and Y slider 5 at a value as high as about ten nm/N.

The measurement device 9 can be provided in the bridge structure 8. The measurement device 9 can be formed by an interferometer. The measurement device 9 can measure the position of the substrate stage 7 by emitting measurement light 10 toward the substrate stage 7 and detecting the measurement light 10 reflected by an interferometer mirror provided on an end face of the substrate stage 7. The measurement device 9 can measure the position of the substrate stage 7 at a position closer than the measurement devices 4 and 6 with respect to the holding surface of the substrate 1 of the substrate stage 7. Note that FIG. 1 shows only one beam of the measurement light 10 emitted from the measurement device 9 to the substrate stage 7, but the measurement device 9 can be formed to be capable of executing measurement with respect to at least the X-axis, Y-axis, θX-axis, θY-axis, and θZ-axis of the substrate stage 7.

To improve the filling property of the imprint material in the pattern of the mold 18, the gas supply 21 supplies a filling gas in the vicinity of the mold 18, more specifically, a space between the mold 18 and the substrate 1. The filling gas includes at least one of a permeable gas and a condensable gas in order to quickly decrease the filling gas (bubbles) confined between the mold 18 and the imprint material, and accelerate filling of the pattern of the mold 18 with the imprint material. The permeable gas is a gas which has high permeability with respect to the mold 18, and is permeated through the mold 18 when the mold 18 is brought into contact with the imprint material on the substrate 1. The condensable gas is a gas which is liquefied (condensed) when the mold 18 is brought into contact with the imprint material on the substrate 1.

The off-axis scope 24 detects a reference mark or alignment mark provided on a reference plate arranged on the substrate stage 7 without intervention of the mold 18. Furthermore, the off-axis scope 24 can detect an alignment mark provided on (each shot region of) the substrate 1. In this embodiment, the pressure sensor 25 can be provided in the substrate stage 7. The pressure sensor 25 can detect the pressure which acts on the substrate stage 7 by bringing the mold 18 into contact with the imprint material on the substrate 1. The pressure sensor 25 can function as a sensor for detecting the contact state between the mold 18 and the imprint material on the substrate 1 by detecting the pressure acting on the substrate stage 7. The pressure sensor 25 may be provided in the imprint head 16. That is, the pressure sensor 25 can be provided in at least one of the imprint head 16 and the substrate stage 7.

The controller 400 can be formed from a PLD (an acronym for Programmable Logic Device) such as an FPGA (an acronym for Field Programmable Gate Array), an ASIC (an acronym for Application Specific Integrated Circuit), a general-purpose computer installed with a program, or a combination of all or some of these components. The controller 400 controls the operation of the imprint apparatus 100. The controller 400 can, for example, control the imprint process and processing related to the imprint process, the generation of a layout recipe, and the like.

The gas supply 21 supplies the filling gas to the space between the mold 18 and the substrate 1. The filling gas supplied between the mold 18 and the substrate 1 can be sucked from the upper portion of the imprint head 16 via the exhaust duct 14 and exhausted outside the imprint apparatus 100. Furthermore, the filling gas supplied between the mold 18 and the substrate 1 may be recovered by a gas recovery mechanism (not shown) instead of being exhausted outside the imprint apparatus 100.

Figure 2A:
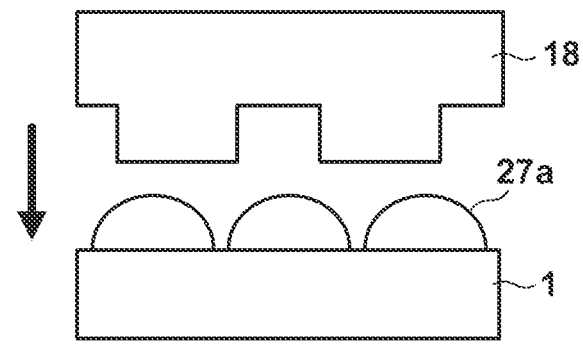
FIGS. 2A to 2D are views schematically showing an imprint process.
Figure 2B:
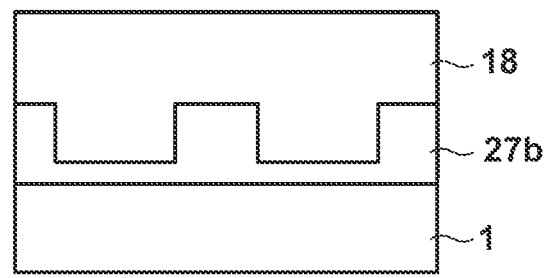
Figure 2C:
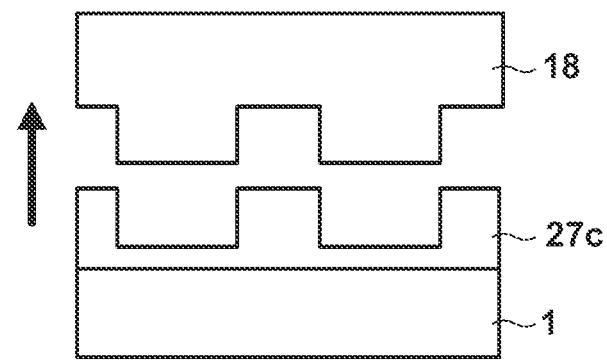
Figure 2D:
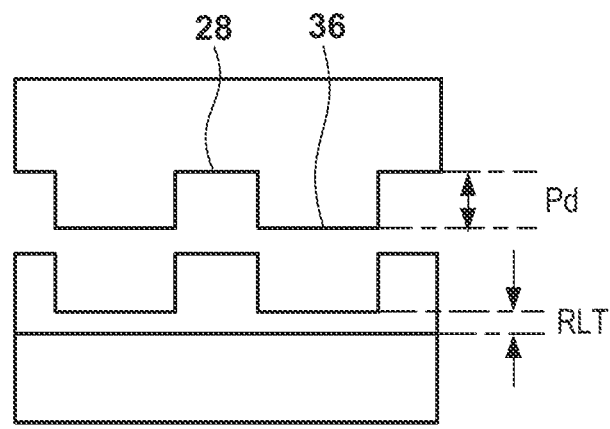

FIGS. 2A to 2D schematically show the imprint process. FIG. 2A shows a state before the pattern surface P of the mold 18 starts to contact the shot region of the substrate 1 to which an imprint material 27a is supplied by the imprint material supply 23. FIG. 2B shows a state in which the pattern surface P of the mold 18 and the imprint material on the shot region of the substrate 1 are in contact with each other. In this state, the imprint material on the shot region of the substrate 1 is irradiated with the curing energy from the curing device 11. As a result, an imprint material 27b is cured. FIG. 2C shows a state in which the mold 18 is released from the cured imprint material on the shot region of the substrate 1 by raising the imprint head 16. Consequently, a pattern 27c corresponding to the pattern on the pattern surface P of the mold 18 remains in the shot region of the substrate 1. FIG. 2D shows the pattern on the pattern surface P of the mold 18 and the cured imprint material. The pattern of the mold 18 includes a convex forming pattern 28 corresponding to a convex pattern to be formed on the substrate 1 and a concave forming pattern 36 for a concave pattern to be formed on the substrate 1. Pd represents a pattern depth, and RLT represents a residual layer thickness.

FIG. 3 shows an example of the arrangement of a discharge head 32 of the dispenser 23. The discharge head 32 can include a plurality of orifices 33 for discharging the imprint material. Although the time required to fill the inside of the convex forming pattern of the mold 18 with the imprint material is shortened by narrowing the layout intervals of the plurality of orifices 33, it may become difficult to manufacture the discharge head 32 if the layout interval is too narrow, and may cause the droplets of the imprint material discharged from the adjacent orifices 33 to interfere with each other. Interference between the plurality of droplets of the imprint material can cause the droplets to bond with each other, thereby resulting in misalignment of the imprint material. In the example of FIG. 3, the plurality of orifices 33 are arrayed so as to form two columns, and a distance L1 between the centers of the orifices 33 in a column direction and an interval L2 between the center lines of the two columns are used as arrangement information of the orifices 33.

The controller 400 can control the order of the imprint process on the plurality of shot regions on the substrate 1 in accordance with a processing recipe (control information). The controller 400 can control the dispenser 23 so that the imprint material is arranged on each imprint material supply target shot region on the substrate 1 in accordance with a layout recipe associated with the shot region. The controller 400 can be formed so as to execute adjustment processing in a case where an elapsed time from the supplying of the imprint material to the shot region until the contact with the mold 18 falls outside an allowable range of a predetermined elapsed time. The adjustment processing is processing to adjust the amount of imprint material on each shot region at the (actual) timing when the imprint material on the shot region is brought into contact with the mold 18. In a case in which the elapsed time is shorter than the predetermined elapsed time, the adjustment processing can include, for example, processing to delay the timing at which the imprint material arranged on the shot region of the substrate is brought into contact with the mold 18. As a result, the amount of imprint material on the mold at the (actual) timing when the imprint material on the shot region is brought into contact with the mold 18 can be reduced by the evaporation of the imprint material. In a case in which the elapsed time is longer than the predetermined elapsed time, the adjustment processing can include, for example, processing to control the dispenser 23 so that the imprint material is additionally supplied to the shot region. As a result, the reduction in the imprint material which was caused by the evaporation of the imprint material can be supplemented.

The controller 400 can be formed so as to determine whether a layout recipe is appropriate based on the elapsed time from the supplying of the imprint material to a shot region until the contact with the mold 18, and to execute error processing in a case where the layout recipe is inappropriate.

Figure 4:
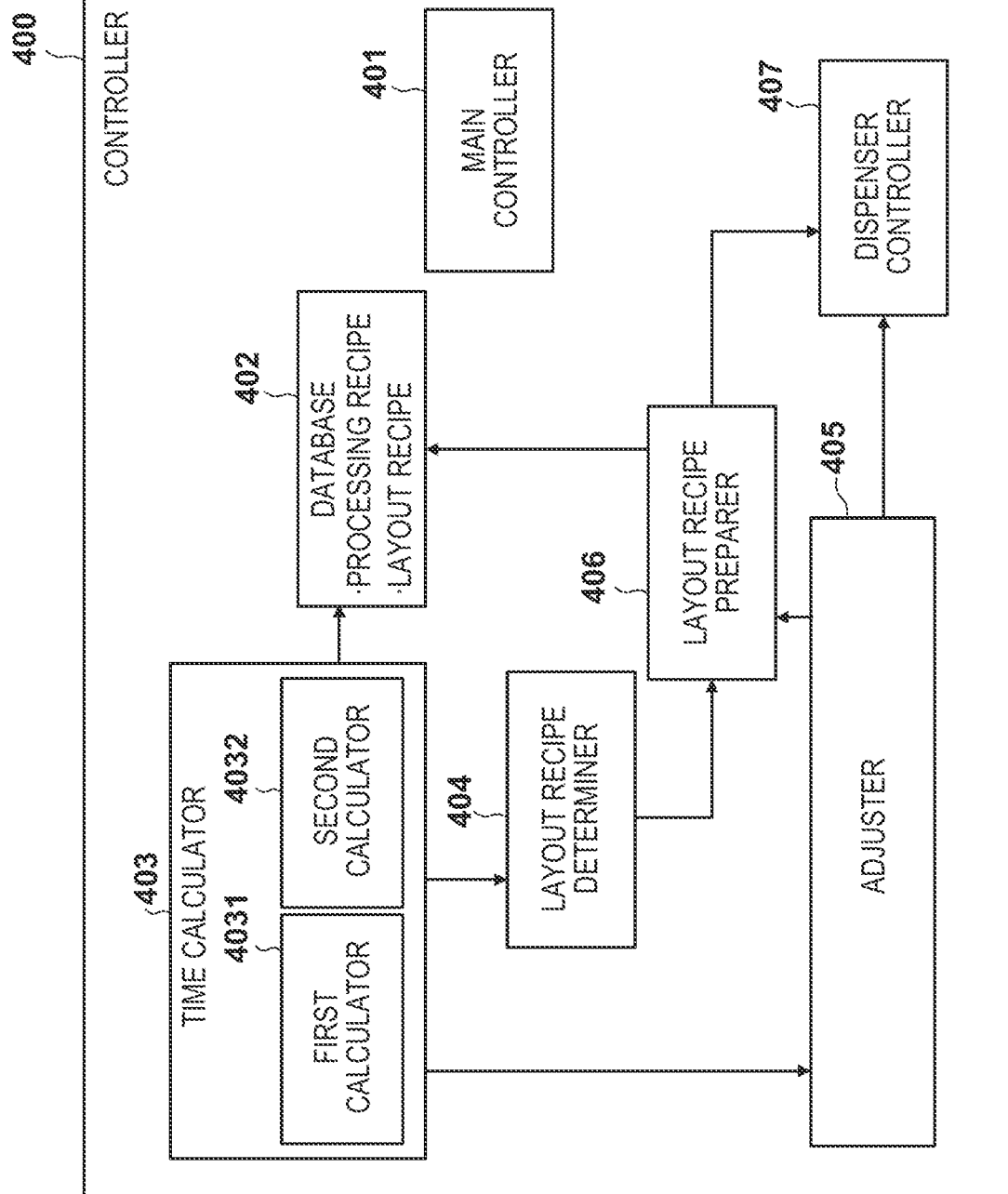
FIG. 4 is block diagram showing an example of the arrangement of a controller of the imprint apparatus.

FIG. 4 shows an example of the arrangement of the controller 400. The controller 400 can include, for example, a main controller 401, a database 402, a time calculator 403, a layout recipe determiner 404, an adjuster 405, a layout recipe preparer 406, and a dispenser controller 407. The main controller 401 controls the overall operation of the imprint apparatus 100, for example, the conveyance of the substrate 1, supplying of the imprint material to the substrate 1, driving of the substrate 1, alignment, curing of the imprint material, driving of the mold 18, and the like. The main controller 401 receives, from the integrated computer 300 via the user interface 34 or the network 301, information necessary for the imprint process and transfers information related to the imprint processing.

The database 402 can store, for example, a processing recipe (control information) for controlling the supplying of the imprint material to each shot region on the substrate and the execution of the imprint process and a layout recipe for controlling the arrangement of the droplets of the imprint material on the substrate. The time calculator 403 can include a first calculator 4031 and a second calculator 4032. The first calculator 4031 calculates, based on the processing recipe stored in the database 402, a predetermined elapsed time required from the supplying of the imprint material to a shot region on the substrate 1 until the contact with the mold 18. The processing recipe includes shot layout information and continuous imprint material supply information, and the first calculator 4031 can calculate the predetermined elapsed time based on the shot layout information and the continuous imprint material supply information. The shot layout information is information indicating the arrangement (layout) of the plurality of shot regions on the substrate 1. The continuous imprint material supply information is information indicating (a group formed from) a plurality of shot regions to which the imprint material is to be supplied by the dispenser 23 and the imprint material supplying order. After the imprint material is supplied to a shot region, the second calculator 4032 calculates, as the (actual) elapsed time, the time (actually) required to supply the imprint material to the shot region until the contact with the mold 18.

The layout recipe determiner 404 determines whether a layout recipe is appropriate based on the predetermined elapsed time from the supplying of the imprint material to the shot region until the contact with the mold 18. The layout recipe determiner 404 compares, for example, a first evaporation amount which is acquired from an evaporation residual ratio included in the layout recipe associated with a determination target shot region and a second evaporation amount which is acquired based on the predetermined elapsed time calculated by the first calculator 4031. The layout recipe determiner 404 determines whether the layout recipe associated with the determination target shot region is appropriate based on the difference between the first evaporation amount and the second evaporation amount. The layout recipe determiner 404 can calculate the second evaporation amount based on, for example, an approximation or a table showing the relationship between the elapsed time and the evaporation amount. The approximation or the table can be provided for each kind of imprint material.

The adjuster 405 executes adjustment processing in a case where the elapsed time calculated by the second calculator 4032 falls outside the allowable range of the predetermined elapsed time calculated by the first calculator 4031. The adjustment processing can be executed by causing the layout recipe preparer 406 to prepare a layout recipe and controlling the dispenser controller 407 in accordance with the layout recipe. Alternatively, the adjustment processing can be processing to delay the contact timing of the mold 18 (than the contact timing of the mold 18 which was set before the execution of the adjustment processing).

The layout recipe preparer 406 prepares a layout recipe for additionally supplying the imprint material to the shot region in a case in which the adjustment processing is executed to additionally supply the imprint material to the shot region. This preparation can be performed by, for example, selecting, from a plurality of additional layout recipes, an additional layout recipe corresponding to an amount of the imprint material to be added or generating an additional layout recipe in accordance with the amount of the imprint material to be added. If the layout recipe determiner 404 determines that the layout recipe associated with the determination target shot region is inappropriate, the layout recipe preparer 406 can execute error processing. The error processing can include, for example, processing to select, from a plurality of layout recipes, an appropriate layout recipe based on the elapsed time calculated by the second calculator 4032. Alternatively, the error processing can include processing to generate an appropriate layout recipe for the shot region based on the elapsed time calculated by the second calculator 4032. Alternatively, the error processing can include processing to warn an operator and cause the operator to input or select an appropriate layout recipe. The dispenser controller 407 controls the dispenser 23 in accordance with the control by the adjuster 405 and the layout recipe prepared by the layout recipe preparer 406.

Figure 5:
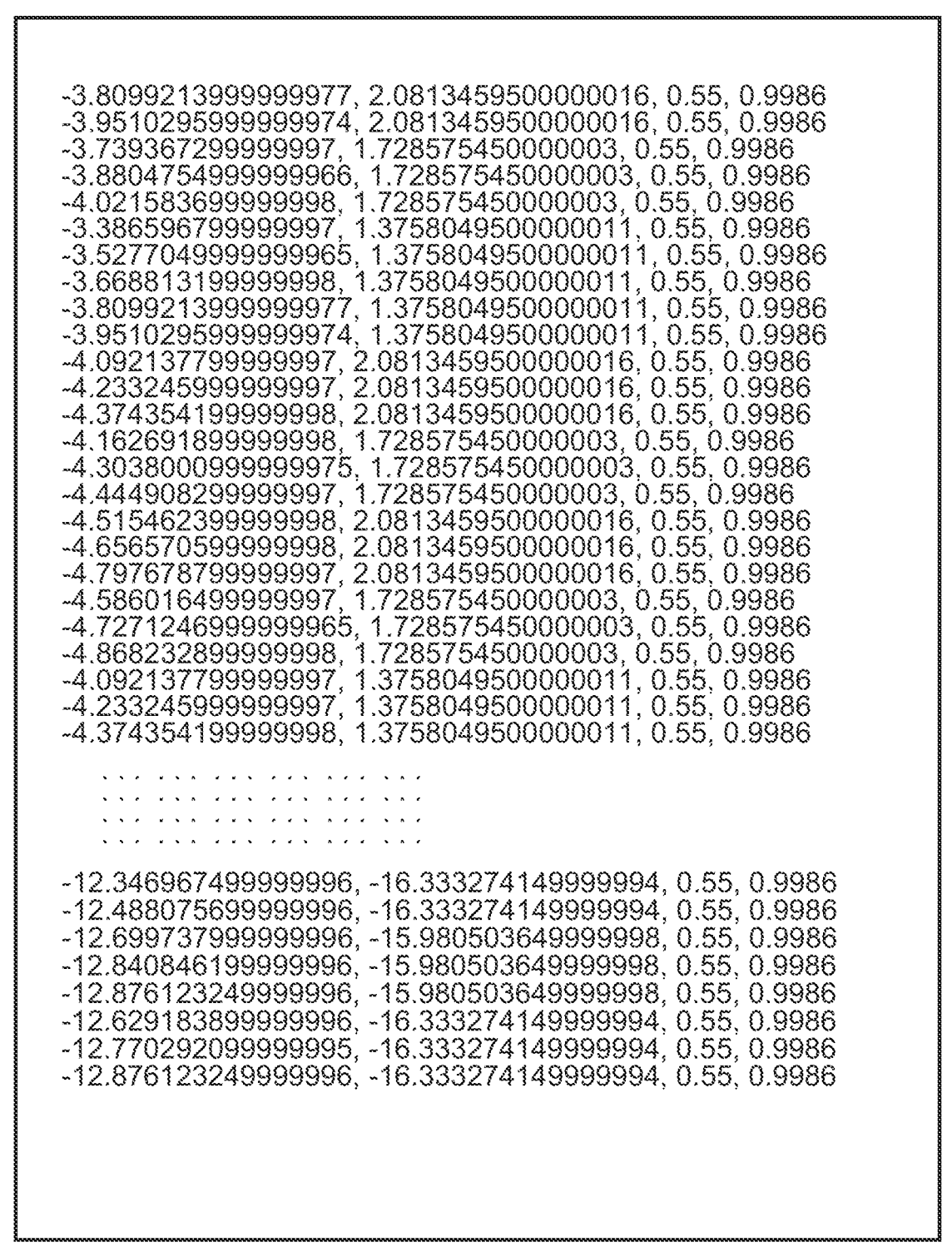

FIG. 5 shows an example of a layout recipe stored in the database. Here, one layout recipe is associated with one shot region. At this time, a single layout recipe may be associated commonly with two or more shot regions. Each layout recipe can include, for example, the X-coordinate, the Y-coordinate, the quantity, and the evaporation residual ratio for each droplet of the imprint material to be arranged on a corresponding shot region. In the example of FIG. 5, the X-coordinate is indicated in the first column (the leftmost column), the Y-coordinate is indicated in the second column, the quantity (volume) is indicated in the third column, and the evaporation residual ratio is indicated in the fourth column. In the example of FIG. 5, the X-coordinate and the Y-coordinate are shown on a millimeter basis with respect to (0, 0) as the center coordinate pair of the shot region. Furthermore, the amount is indicated on a picoliter basis. The evaporation residual ratio is a value acquired by dividing the amount (deposition) of an imprint material (one droplet) remaining when the mold 18 is brought into contact with the imprint material by the amount (deposition) of an imprint material (one droplet) supplied to the shot region. The value of the evaporation residual ratio becomes smaller in proportion to the elapsed time from the supplying of the imprint material to the shot region.

Figure 6A:
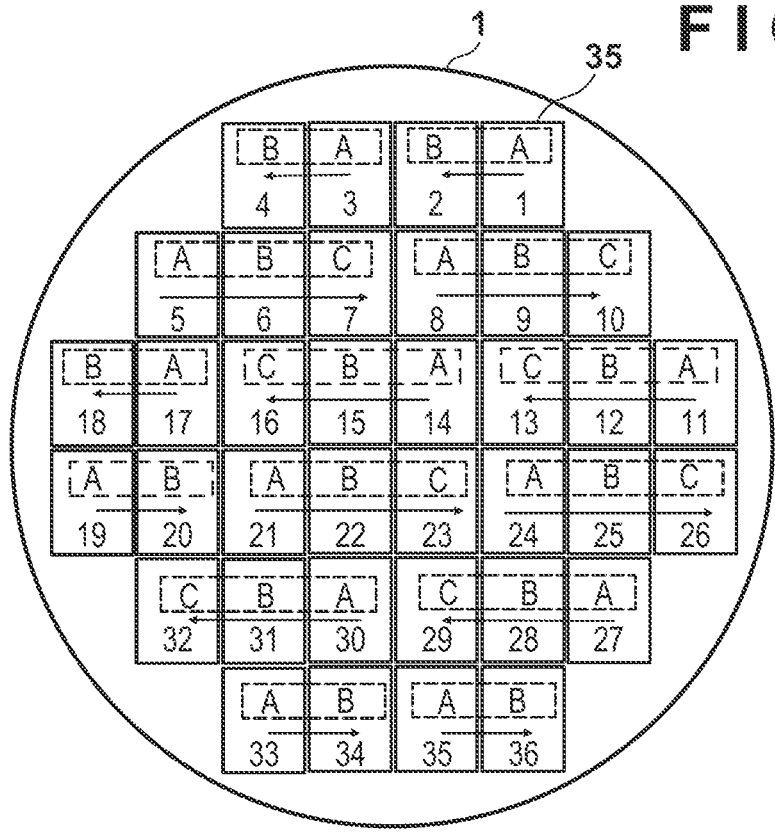
FIG. 6A is a view showing an example of a shot layout.

FIG. 6A shows a visualized processing recipe with a shot layout. A plurality of shot regions 35 are arranged on the substrate 1. Each shot region 35 is indicated as a rectangle. The number inside each rectangle indicates the order (in other words, the shot number) in which the imprint process is to be executed, and this number is defined in the processing recipe. Reference symbols A, B, and C indicate the types of layout recipes associated with the shot region 35. A group formed by A and B or A, B, and C surrounded by a broken line indicates a group that is to undergo the imprint process (contact with the mold 18 and curing) after the imprint material is supplied continuously. The supplying of the imprint material is executed in the order indicated by an arrow, and the imprint process is performed in ascending order of the number in the rectangle.

The shot regions to which the imprint material is to be supplied in accordance with the layout recipe A are shot regions whose shot numbers are 1, 3, 5, 8, 11, 14, 17, 19, 21, 24, 27, 30, 33, and 35. The shot regions to which the imprint material is to be supplied in accordance with the layout recipe B are shot regions whose shot numbers are 2, 4, 6, 9, 12, 15, 18, 20, 22, 25, 28, 31, 34, and 36. The shot regions, to which the imprint material is to be supplied in accordance with the layout recipe C, are shot regions whose shot numbers are 7, 10, 13, 16, 23, 26, 29, and 32.

The predetermined elapsed time required from the supplying of the imprint material to the shot region until the contact with the mold 18 is $$\text{layout recipe } A < \text{layout recipe } B < \text{layout recipe } C \quad (1)$$

wherein the "layout recipe A" represents the predetermined elapsed time of a shot region to which the imprint material is supplied in accordance with the layout recipe A. The "layout recipe B" represents the predetermined elapsed time of a shot region to which the imprint material is supplied in accordance with the layout recipe B. The "layout recipe C" represents the predetermined elapsed time of a shot region to which the imprint material is supplied in accordance with the layout recipe C.

The evaporation amount of the imprint material depends on (is proportional to) the time from the arrangement of the imprint material until the mold 18 is brought into contact with the imprint material. To make the residual layer thickness RLT uniform, the "quantity" of imprint material in the layout recipe can be determined in accordance with the evaporation amount.

The "quantities" of imprint material in the layout recipes A, B, and C, respectively, are defined as $$\text{layout recipe } A < \text{layout recipe } B < \text{layout recipe } C \quad (2)$$

wherein the "layout recipe A" represents the evaporation amount of the imprint material in a shot region to which the imprint material is supplied in accordance with the layout recipe A. The "layout recipe B" represents the evaporation amount of the imprint material in a shot region to which the imprint material is supplied in accordance with the layout recipe B. The "layout recipe C" represents the evaporation amount of the imprint material in a shot region to which the imprint material is supplied in accordance with the layout recipe C.

Although the number of shot regions forming a group to which the imprint material is to be continuously supplied is 2 or 3 in the processing recipe shown in FIG. 6A, the number of shot regions may be 4 or more.

Figure 6B:
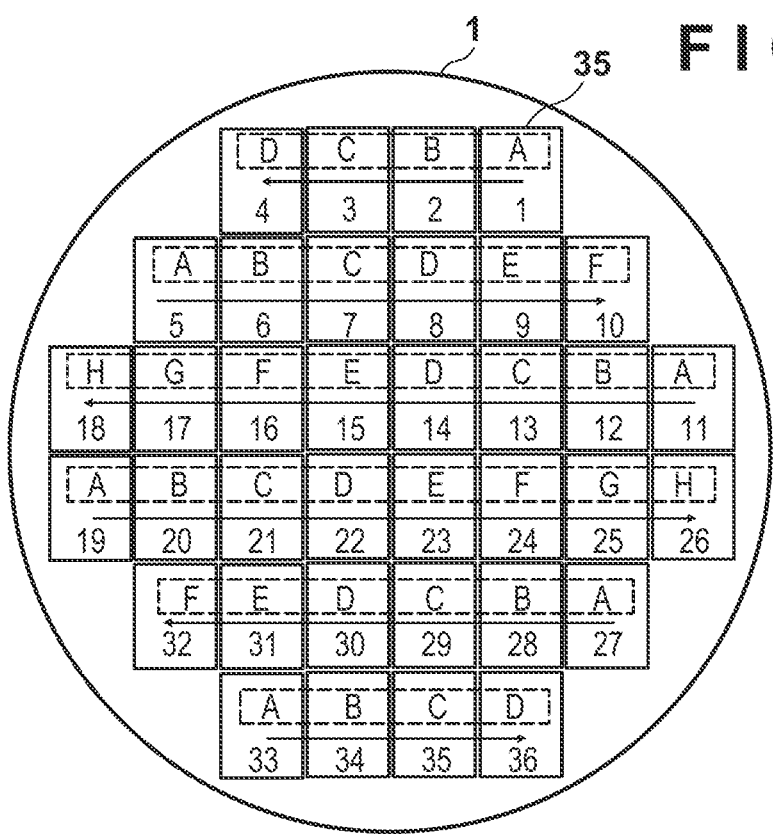
FIG. 6B is a view showing an example of another shot layout.

FIG. 6B shows another example of a visualized processing recipe with the shot layout. The notation method in the example of FIG. 6B is in accordance with that in the example of FIG. 6A. Reference symbols A, B, C, D, E, F, G, and H indicate the types of layout recipes associated with the shot region 35. A group encircled by a broken line indicates a group which is to undergo the imprint process (contact with the mold 18 and curing) after the imprint material has been continuously supplied. In the example of FIG. 6B, one row in the shot layout forms one group.

Figure 9A:
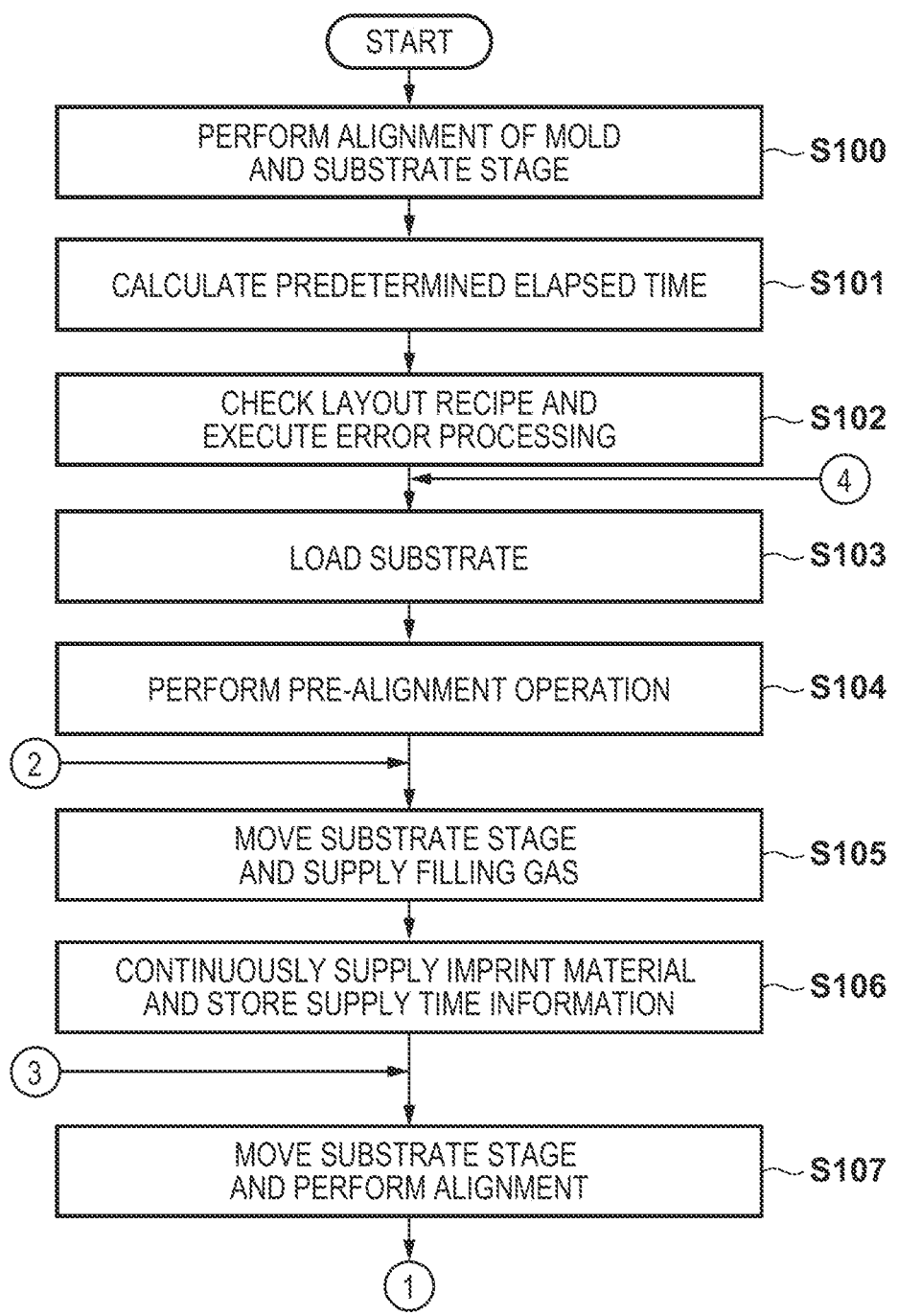
Figure 10:
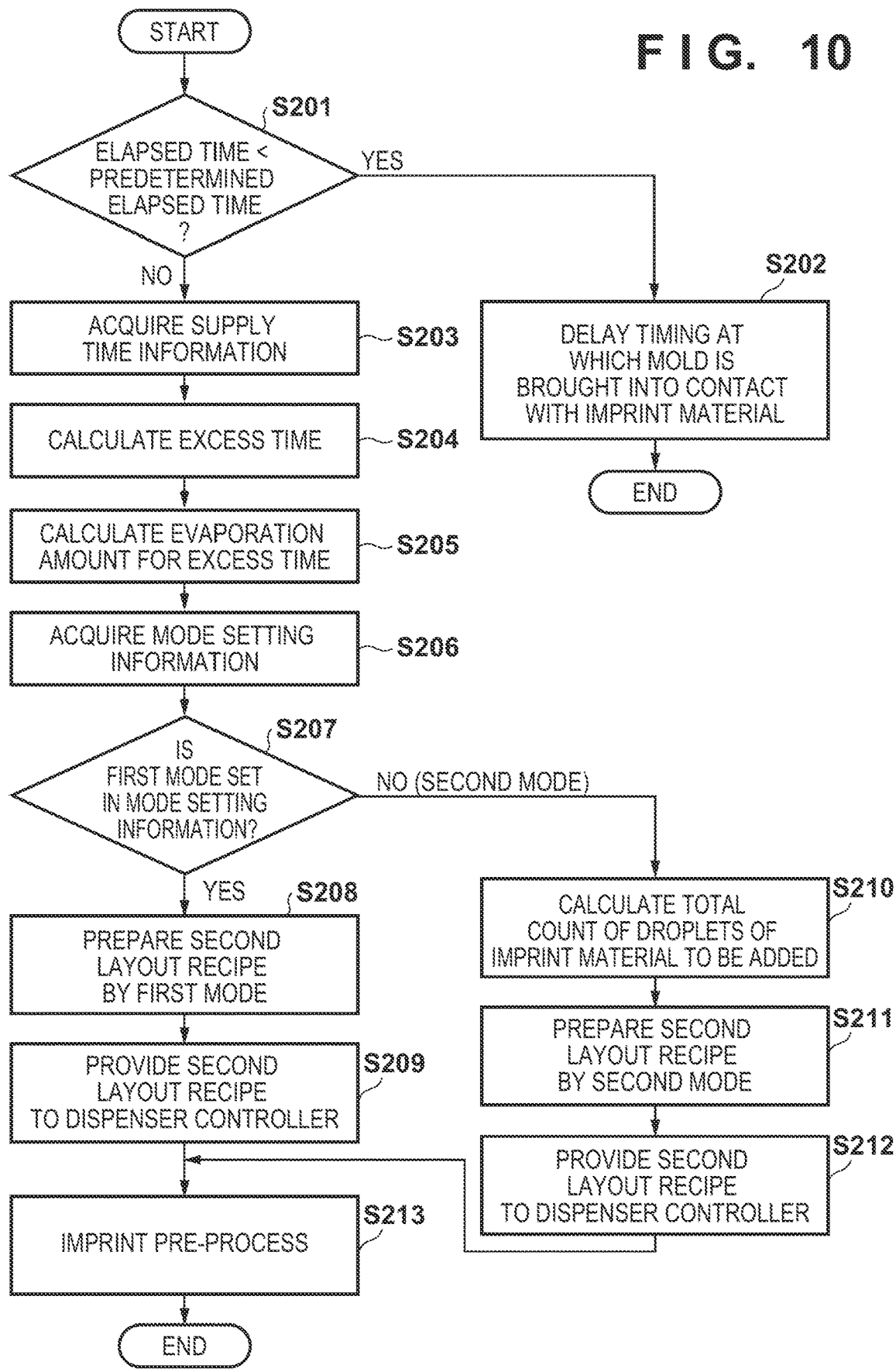
FIG. 10 is a flowchart showing an example of the operation of the imprint apparatus.

FIGS. 9A, 9B, and 10 show an operation example of the imprint apparatus 100 according to the first embodiment. The operation according to the operation example is controlled by the controller 400. In step S100, the alignment of the mold 18 and the substrate stage 7 is performed based on the result of the alignment measurement by the alignment measurement device 12. At this time, the mold 18 is loaded into the imprint apparatus 100 by a conveyance system (not shown), transferred to the mold chuck 17, and held by the mold chuck 17. Each mark (alignment mark) to be detected by the alignment measurement device 12 may be provided as a dedicated reference mark on the substrate stage 7 or may be provided on a dedicated alignment substrate.

In step S101, a predetermined elapsed time, from the arrangement of the imprint material until the mold 18 is brought into contact with the imprint material, is calculated by the first calculator 4031 of the time calculator 403 based on the following information stored in the database 402, and the result of the calculation is stored in the memory.

(1) Shot layout
(2) Distance from the dispenser 23 to the imprint position
(3) Movement profile of the substrate stage 7
(4) The shot numbers and order of each group which is to be continuously supplied with the imprint material
(5) Time required to perform the imprint process on one shot region (imprint time)

Here the shot layout information of (1) described above is information included in the processing recipe. The center coordinate pair of each of the shot regions, which are to be continuously supplied with the imprint material, can be acquired based on the shot layout information, and each distance between the shot regions which are to be continuously supplied with the imprint material can be acquired from the corresponding center coordinate pairs. The time required for movement can be calculated based on the distance information of (3) described above.

Figure 7:
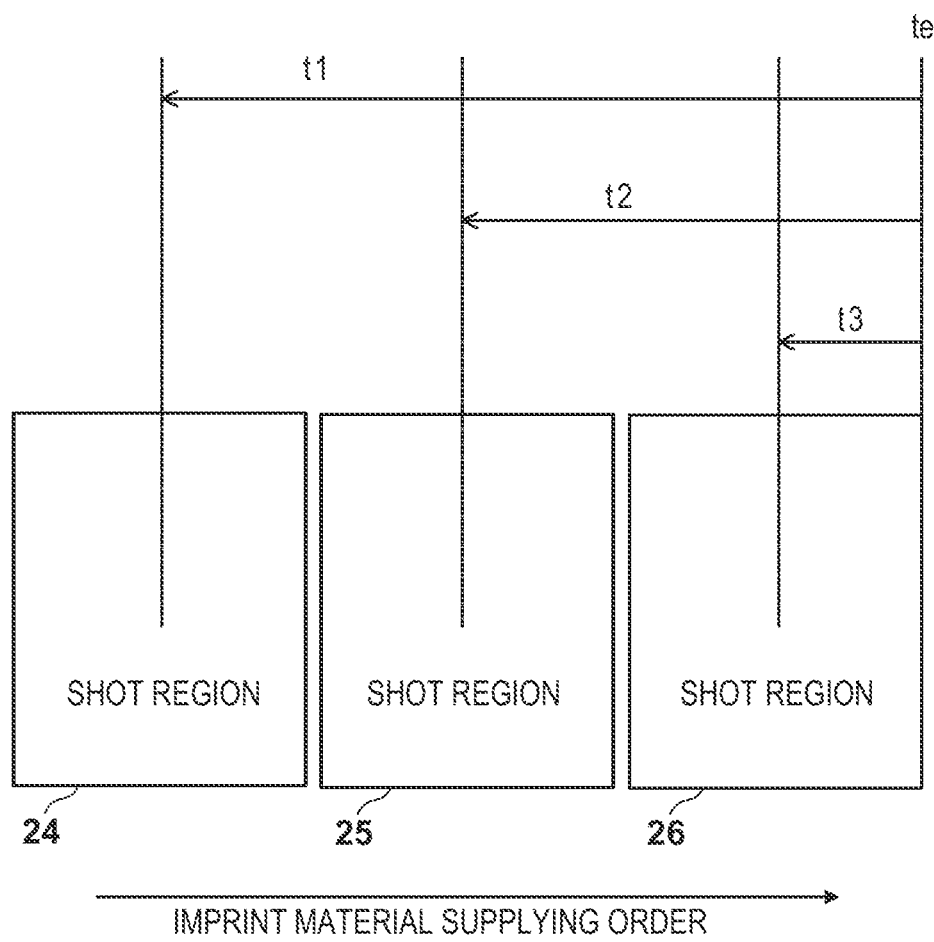
FIG. 7 is a view showing an example of a plurality of shot regions that form a group which is to be continuously supplied with an imprint material.

FIG. 7 schematically shows the differences between the timings at which the imprint material is supplied to the shot regions that have been assigned with shot numbers 24, 25, and 26, respectively, and form the group which is to be continuously supplied with the imprint material. A timing to is the timing at which the continuous supplying of the imprint material to the group formed by the shot regions of shot numbers 24, 25, and 26 is completed. Time t1 is the time from the supply timing of the imprint material to a representative position (for example, the center) of the shot region of shot number 24 until the timing te. Time t2 is the time from the supply timing of the imprint material to a representative position (for example, the center) of the shot region of shot number 25 until the timing te. Time t3 is the time from the supply timing of the imprint material to a representative position (for example, the center) of the shot region of shot number 26 until the timing te. The first calculator 4031 can calculate time t1, time t2, and time t3 based on the dimension of one shot region and the speed of the substrate stage 7 when the imprint material is to be arranged on the substrate 1.

FIG. 8 schematically shows the predetermined elapsed time of each of the shot regions with the shot numbers 24, 25, and 26 in the example of FIG. 6A. The predetermined elapsed time is calculated by the first calculator 4031.

<Predetermined Elapsed Time T1 for Shot Region of Shot Number 24>

Based on the information of aforementioned (4), the first calculator 4031 can determine that the shot region of shot number 24 is the first shot region of the group. Based on the above-described information of (2) and (3), the first calculator 4031 can calculate the movement time required for moving the shot region of shot number 24 from a position under the dispenser 23 to an imprint position (position under the mold 18). A predetermined elapsed time T1 can be calculated as the sum of the movement time and time t1 by the first calculator 4031.

<Predetermined Elapsed Time T2 for Shot Region of Shot Number 25>

Based on the information of aforementioned (4), the first calculator 4031 can determine that the shot region of shot number 25 is the second shot region of the group. The first calculator 4031 can calculate the step time required to move from the shot region of shot number 24, which is calculated based on the pieces of information of aforementioned (1) and (3), to the shot region of shot number 25. A predetermined elapsed time T2 can be calculated as the sum of the aforementioned movement time, the imprint time of aforementioned (5), the step time, and time t2 by the first calculator 4031.

<Predetermined Elapsed Time T3 for Shot Region of Shot Number 26>

Based on the information of aforementioned (4), the first calculator 4031 can determine that the shot region of shot number 26 is the third shot region of the group. The first calculator 4031 can calculate the step time required to move from the shot region of the shot number 25, which is calculated based on the pieces of information of aforementioned (1) and (3), to the shot region of shot number 26. A predetermined elapsed time T3 can be calculated as the sum of the aforementioned movement time, the imprint time of aforementioned (5), the two step times, and time t3 by the first calculator 4031.

Here, the imprint time can include, for example, the time required for each of the following processes. Pieces of information related to these times are registered in advance in the controller 400 and are referred to as required:

(a) an alignment mark measurement process performed before the contact between the imprint material and the mold 18 (pre-contact alignment measurement);

(b) an alignment driving process with respect to the X-, Y-, and Z-axes using an estimated value or the result of the alignment mark measurement;

(c) a driving process to lower the mold 18 to bring the mold 18 and the imprint material into contact with each other (contact driving);

(d) an alignment process of the mold 18 and the shot region performed in the contact state of the imprint material and the mold 18;

(e) a standby process until the pattern (concave portion) of the mold 18 is filled with the imprint material;

(f) a curing process on the imprint material; and (g) a driving process to raise the mold 18 to release the mold 18 from the cured imprint material (separation driving).

In step S102, the layout recipe determiner 404 calculates, based on a preset evaporation characteristic and the predetermined elapsed time calculated in step S101, the second evaporation amount which is the evaporation amount of the imprint material in the lapse of the predetermined elapsed time for each shot region. The evaporation characteristic is a characteristic indicating the relationship between the elapsed time and the evaporation amount. The layout recipe determiner 404 stores, in association with each shot region, the second evaporation amount as the value of "EvapoAmountMachine" in a management table as shown in FIG. 12. In addition, in step S102, the layout recipe determiner 404 calculates the first evaporation amount which is the evaporation amount of the imprint material based on the evaporation residual ratio in the layout recipe. The layout recipe determiner 404 stores, in association with each shot region, the first evaporation amount as the value of "EvapoAmountDRF" in the management table as shown in FIG. 12. Also, in step S102, the layout recipe determiner 404 calculates the difference between the "EvapoAmountDRF" (first evaporation amount) and the "EvapoAmountMachine" (second evaporation amount) for each shot region. The layout recipe determiner 404 stores this difference as the value of "DiffAmount" in the management table as shown in FIG. 12. Additionally, in step S102, the layout recipe determiner 404 determines whether the layout recipe associated with each shot region is appropriate based on the difference between the first evaporation amount and the second evaporation amount.

Furthermore, in step S102, if the layout recipe determiner 404 determines that the layout recipe associated with a shot region is inappropriate, the layout recipe preparer 406 can execute the error processing. The error processing can include, for example, processing to select, based on the elapsed time calculated by the second calculator 4032, an appropriate layout recipe for the shot region from the plurality of layout recipes. Alternatively, the error processing can include processing to generate, based on the elapsed time calculated by the second calculator 4032, an appropriate layout recipe for the shot region. Alternatively, the error processing can include processing to warn the operator and cause the operator to input or select the appropriate layout recipe. The dispenser controller 407 controls the dispenser 23 in accordance with the control by the adjuster 405 and the layout recipe prepared by the layout recipe preparer 406.

In step S103, the substrate 1 is loaded to the chamber 200 of the imprint apparatus 100, conveyed to the substrate chuck of the substrate stage 7, and held by the substrate chuck. In step S104, a pre-alignment operation is performed.

In the pre-alignment operation (step S104) performed first after the substrate 1 is loaded to the imprint apparatus 100, the substrate 1 is moved below the off-axis scope 24, and the position of the substrate 1 is measured by the off-axis scope 24. The pre-alignment operation at this time is performed with accuracy (of about 1 µm to 2 µm) so that an alignment mark provided in each shot region of the substrate 1 will fall within the measurement range of the alignment measurement device 12 in the alignment measurement operation (step S107).

In step S105, the substrate stage 7 is moved so that the first shot region of the plurality of shot regions forming the imprint material supply target group will be positioned below the dispenser 23. The gas supply 21 supplies a filling gas to the space between the mold 18 and the substrate 1.

In step S106, the dispenser 23 continuously supplies the imprint material to the imprint target shot regions of the plurality of shot regions forming the imprint material supply target group. At this time, the controller 400 stores, with each piece of shot number information, the supply time information which indicates the timing at which the imprint material has been supplied to a corresponding shot region.

In step S107, the imprint target shot region of the plurality of shot regions forming the group is positioned below the mold 18, and the alignment measurement is performed by the alignment measurement device 12 in a non-contact state of the imprint material and the mold 18. In step S107, a gap which is a difference in the height direction of the substrate 1 and the mold 18 can be measured. Here, if the driving operation to bring the imprint material and the mold 18 into contact with each other is not started in a state in which the shot region and the mold 18 have been controlled to be in appropriate relative positions, the imprint material can overflow from the shot region or a defect due to a lack of filling can occur.

In step S108, the second calculator 4032 of the time calculator 403 calculates the elapsed time from the supplying of the imprint material to the shot region until the contact with the mold 18. The elapsed time can be calculated based on the current time information and the supply time information indicating the time when the imprint material was supplied to the shot region. Additionally, in step S108, it is determined whether the elapsed time falls within the allowable range of the predetermined elapsed time from the supplying of the imprint material until the contact with the mold 18. If the elapsed time falls within the allowable range of the predetermined elapsed time, the process advances to step S110. Otherwise, the process advances to step S109. In step S109, the adjustment processing is executed. The adjustment processing will be described in detail later.

In step S110, based on the gap described above, the mold 18 is driven so that the pattern surface P of the mold 18 and the imprint material on the imprint target shot region of the substrate 1 will come into contact. Additionally, in this state, the alignment of the mold 18 and the imprint target shot region is performed based on the alignment measurement operation by the alignment measurement device 12. This alignment operation is called die-by-die alignment. In step S111, in the contact state between the pattern surface P of the mold 18 and the imprint material on the substrate 1, the imprint material on the imprint target shot region is irradiated with the curing energy from the curing device 11 via the mold 18.

In step S112, the cured imprint material and the mold 18 are separated. As a result, an imprint material pattern corresponding to the pattern of the pattern surface P of the mold 18 is left on the imprint target shot region of the substrate 1. That is, a pattern corresponding to the pattern of the pattern surface P of the mold 18 is formed on the imprint target shot region of the substrate 1.

In step S113, it is determined whether the imprint process has been completed for all of the plurality of shot regions forming the group to be continuously supplied with the imprint material. If the imprint process has not been completed for all of the plurality of shot regions forming the group, the process returns to step S107. Otherwise, the process advances to step S114.

In step S114, it is determined whether the pattern has been formed in every designated shot region in the substrate 1. If the pattern has not been formed in every designated shot region in the substrate 1, the process returns to step S105. If the pattern has been formed in every designated shot region in the substrate 1, the process advances to step S115. In step S115, the substrate 1 is unloaded from the imprint apparatus 100.

In step S116, it is determined whether the imprint process has been performed for every designated substrate 1. If the imprint process has not been performed for every designated substrate 1, the process returns to step S103 to perform the imprint process on the next substrate 1. If the imprint process has been performed on every designated substrate 1, the processing ends.

A detailed example of the adjustment processing that is executed in step S109 of FIGS. 9A and 9B will be described next with reference to FIG. 10. In step S201, the controller 400 determines whether the elapsed time is shorter than the predetermined elapsed time. If the elapsed time is shorter than the predetermined elapsed time, the process advances to step S202. If the elapsed time is longer than the predetermined elapsed time, the process advances to step S203.

A case in which the elapsed time becomes shorter than the predetermined elapsed time can be, for example, a case in which the imprint time of the preceding shot region is shorter than a predetermined imprint time, a case in which the order of the imprint process has been changed, or a case in which a preceding imprint process has been skipped. For example, in the example of FIG. 6A, the execution order of the imprint process has been defined in the processing recipe so that the imprint process will be executed in the order of the shot number 24, 25, and 26. However, if the order of the shot region of the shot number 25 and the shot region of the shot number 26 is switched by the operator or the controller 400, the elapsed time of the shot region of shot number 26 will be shorter than the predetermined elapsed time. Also, if the imprint process of the shot region of shot number 25 is skipped, the elapsed time of the shot region of shot number 26 will be shorter than the predetermined elapsed time.

A case in which the elapsed time becomes longer than the predetermined elapsed time can be, for example, a case in which the imprint time of the preceding shot region is longer than the predetermined imprint time or a case in which the order of the imprint process has been changed. A case in which the imprint time of the preceding shot region is longer than the predetermined imprint time can be, for example, a case in which an abnormality occurs while the preceding shot region is being processed and the process has been restarted after suspension. For example, in the example of FIG. 6A, the execution order of the imprint process has been defined in the processing recipe so that the imprint process will be executed in the order of the shot number 24, 25, and 26. However, if the order of the shot region of the shot number 25 and the shot region of the shot number 26 is switched by the operator or the controller 400, the elapsed time of the shot region of shot number 25 will be longer than the predetermined elapsed time. Also, if an abnormality occurs while the shot region of shot number 25 is processed and the process has been restarted after suspension, the elapsed time of the shot region of shot number 26 will be longer than the predetermined elapsed time.

Other than examples described above, a change in the time (for example, the imprint time) required to process a preceding shot region can be caused by, for example, a change in the time required for the alignment operation in step S110, a change in the curing energy used in step S111, a change in the curing performance of the imprint material, or the like.

In step S202, the adjuster 405 executes, as the adjustment processing, processing to delay the timing to bring the mold 18 into contact with the imprint material for the amount of time corresponding to difference between the predetermined elapsed time and the elapsed time.

In step S203, the adjuster 405 extracts, based on the supply time information and the shot number information stored in step S106, the supply time information indicating the time at which the imprint material was supplied to the imprint target shot region. In step S204, the adjuster 405 calculates an excess time which is the total of the difference between the predetermined elapsed time and the elapsed time, which is acquired from the current time information and the supply time information extracted in step S203, and the additional time required to additionally supply the imprint material to the imprint target shot region. Here, the additional time can include the time to drive the imprint target shot region to the position below the dispenser 23, the time required for the addition of the imprint material by the dispenser 23, and the time subsequently required to position the shot region to the position below the mold 18, and the like.

In step S205, the adjuster 405 determines, based on the preset evaporation characteristic and the excess time calculated in step S204, the evaporation amount of the imprint material during the elapsed time (in other words, the amount of imprint material to be additionally supplied). In step S206, the adjuster 405 acquires an imprint material addition mode set in the processing recipe. The imprint material addition mode can include a first mode and a second mode. The first mode is a mode to arrange the imprint material in the same position as the position of the imprint material already arranged in accordance with the layout recipe used in step S106. The amount of each droplet of the imprint material, which is to be additionally supplied in the first mode, can be adjusted by adjusting, for example, the signal waveform (the signal waveform to be applied to a discharge driving element) that controls the discharging of the imprint material from the orifices of the dispenser 23. Alternatively, the amount of each droplet of the imprint material, which is to be additionally supplied in the first mode, can be adjusted by providing a variable throttle in each orifice and adjusting the variable throttle. The second mode is a mode to arrange the imprint material in a position different from the position of the imprint material already arranged in accordance with the layout recipe used in step S106.

In step S208, the layout recipe preparer 406 acquires the droplet count of the imprint material in the layout recipe used in step S106 and stores the acquired droplet count in a variable DropNum. The layout recipe preparer 406 also stores the evaporation amount of the imprint material determined in step S205 in a variable EvapoAmount. Furthermore, the layout recipe preparer 406 calculates an additional discharge amount AddOneDropAmount for each droplet of imprint material in accordance with $$AddOneDropAmount\ [pL] = EvapoAmount\ [pL] \div DropNum \quad (3)$$

The layout recipe preparer 406 generates a second layout recipe by substituting the "quantity" of imprint material in the layout recipe (to be referred to as the "first layout recipe" hereinafter for discrimination) used in step S106 with the variable AddOneDropAmount. In step S209, the layout recipe preparer 406 provides the second layout recipe generated in step S208 to the dispenser controller 407.

In step S210, the layout recipe preparer 406 acquires the "quantity" of the imprint material in the layout recipe used in step S106 and stores the acquired "quantity" in the variable OneDropAmount. The layout recipe preparer 406 stores the evaporation amount of the imprint material determined in step S205 in the variable EvapoAmount. The layout recipe preparer 406 calculates the droplet count DropNum of the imprint material to be additionally supplied in accordance with $$AddDropNum = EvapoAmount\ [pL] \div OneDropAmount\ [pL] \quad (4)$$

In step S211, the layout recipe preparer 406 generates the second layout recipe for arranging the imprint material, corresponding to the droplet count DropNum calculated in step S210, in positions different from the imprint material positions defined in the layout recipe (referred to as the "first layout recipe" hereinafter for discrimination) used in step S106. In step S212, the layout recipe preparer 406 provides the second layout recipe generated in step S211 to the dispenser controller 407.

In step S213, the controller 400 executes an imprint pre-process operation. In the imprint pre-process operation, the substrate stage 7 is moved so that the shot region (imprint target shot region) to which the imprint material is to be additionally supplied will be positioned below the dispenser 23. Next, in the imprint pre-process operation, the gas supply 21 supplies the filling gas to the space between the mold 18 and the substrate 1. Next, in the imprint pre-process operation, the dispenser 23 additionally supplies, in accordance with the second layout recipe, the imprint material to each shot region to which the imprint material is to be added. Subsequently, the process advances to step S110 of FIG. 9B.

Figure 11:
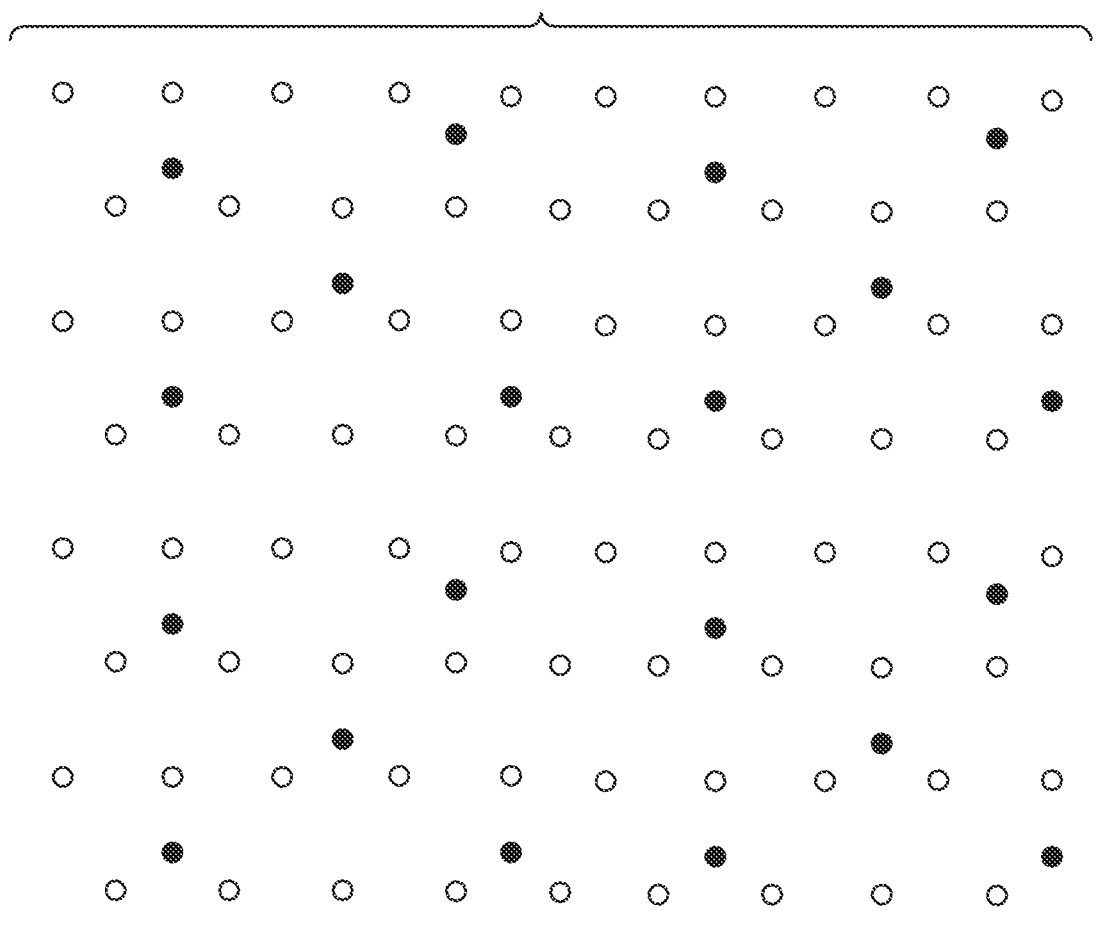
FIG. 11 is a view showing an example of a first layout recipe and a second layout recipe in a second mode.

FIG. 11 exemplifies the imprint material layout defined by the first layout recipe and the imprint material layout defined by the second layout recipe. Here, a white circle indicates the imprint material layout defined by the first layout recipe, and a black circle indicates the imprint material layout defined by the second layout recipe in the second mode. In the second mode, the imprint material corresponding to the droplet count DropNum is distributed and arranged in positions different from the positions of the imprint material already arranged in accordance with the first layout recipe used in step S106. The second mode is effective for a case in which the dispenser 23 does not have the function of adjusting each droplet amount of the imprint material. Alternatively, the second mode is effective for shortening the time required to fill the pattern surface P of the mold 18 with the imprint material.

FIG. 12 shows the management table corresponding to the shot layout shown in FIG. 6A. The management table can hold a shot number (SHOT #), a file name of the layout recipe (DropRecipeFile), and an evaporation coefficient (EvapoRatio). The management table can also hold the first evaporation amount (EvapoAmountDRF) calculated from the layout recipe and the second evaporation amount (EvapoAmountMachine) calculated from the processing recipe and the apparatus information. The management table can hold the difference information (DiffAmount) between the first evaporation amount and the second evaporation amount.

Figure 13A:
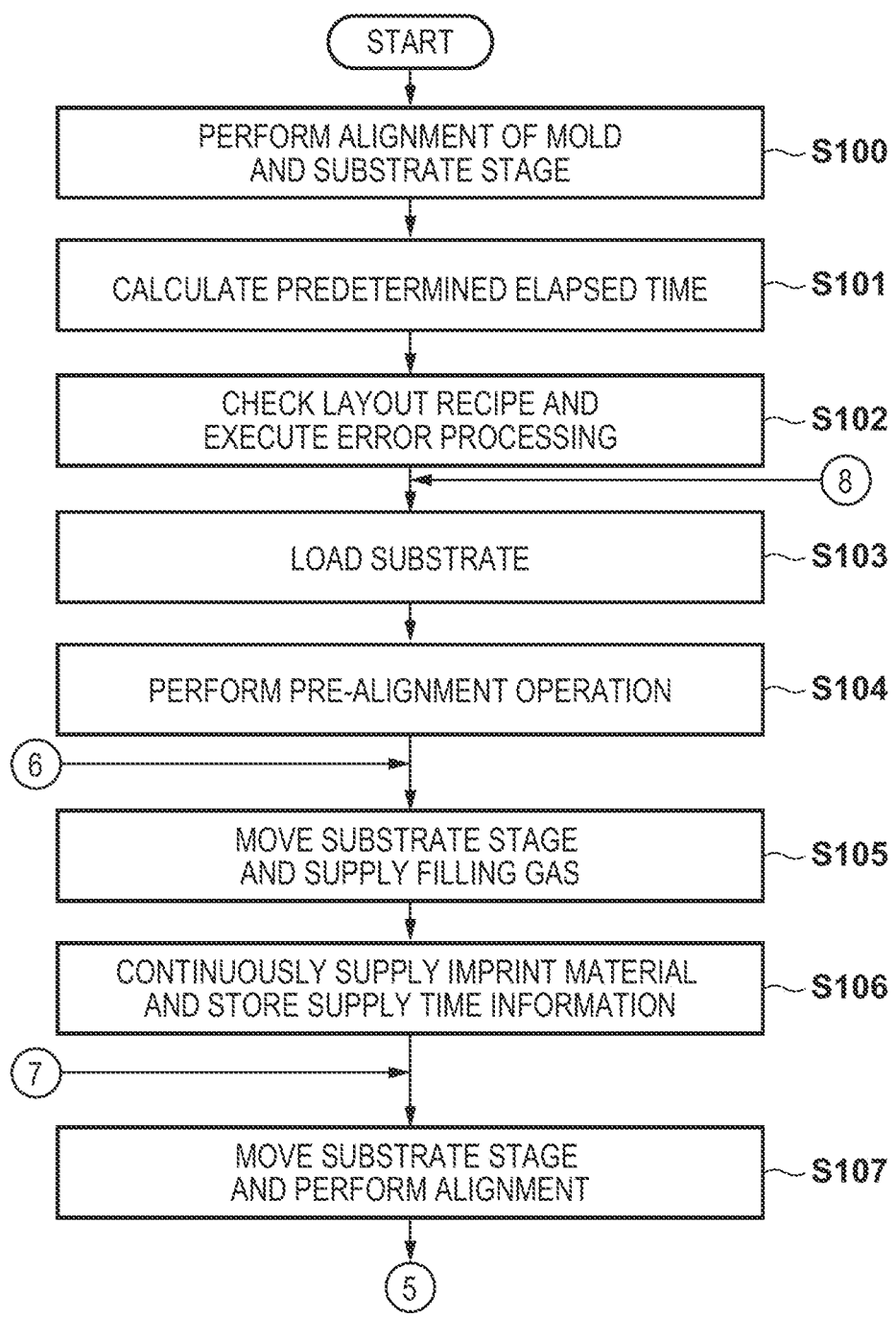
FIGS. 13A and 13B show a flowchart showing an example of the operation of an imprint apparatus according to the second embodiment.
Figure 13B:
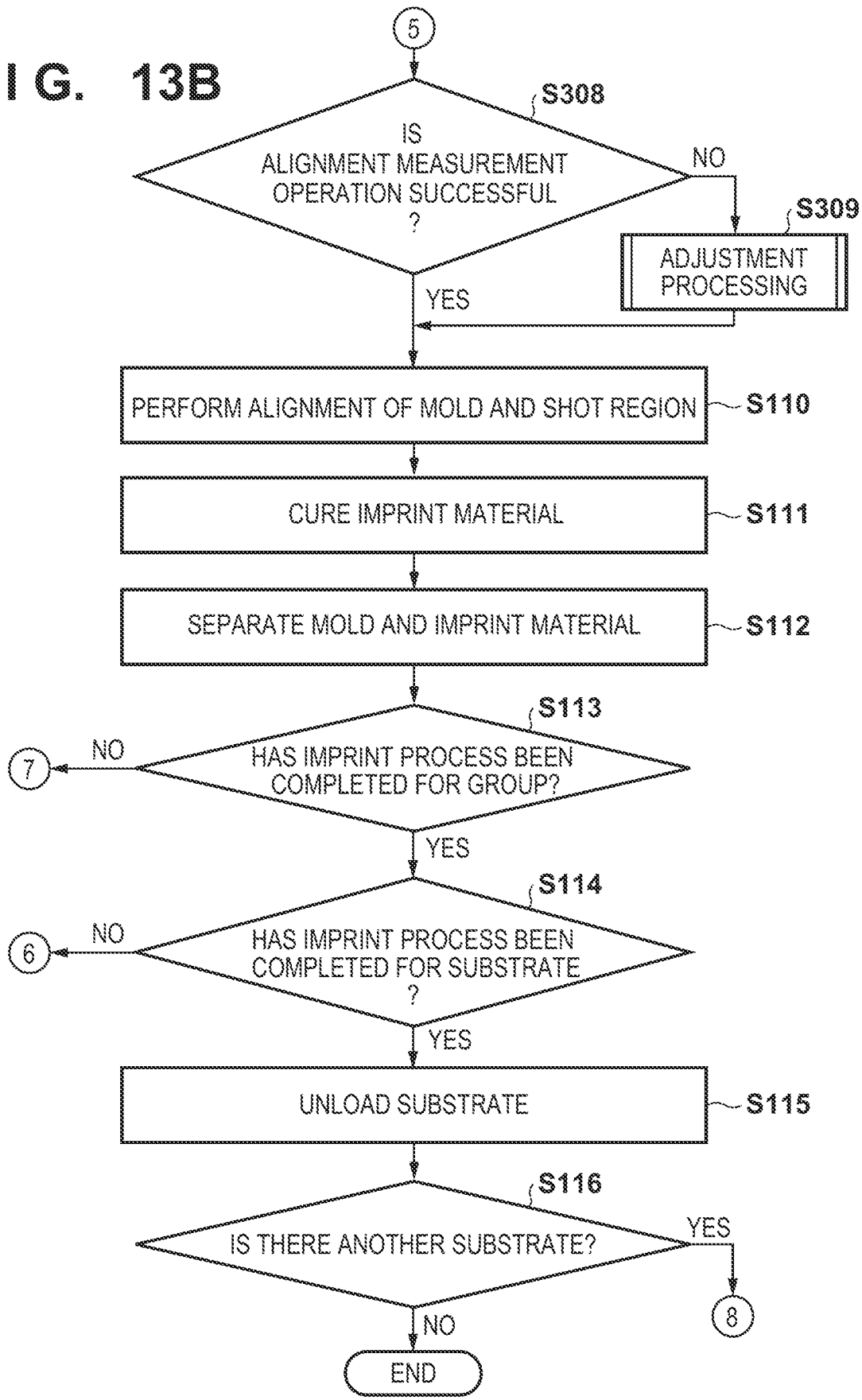
Figure 14A:
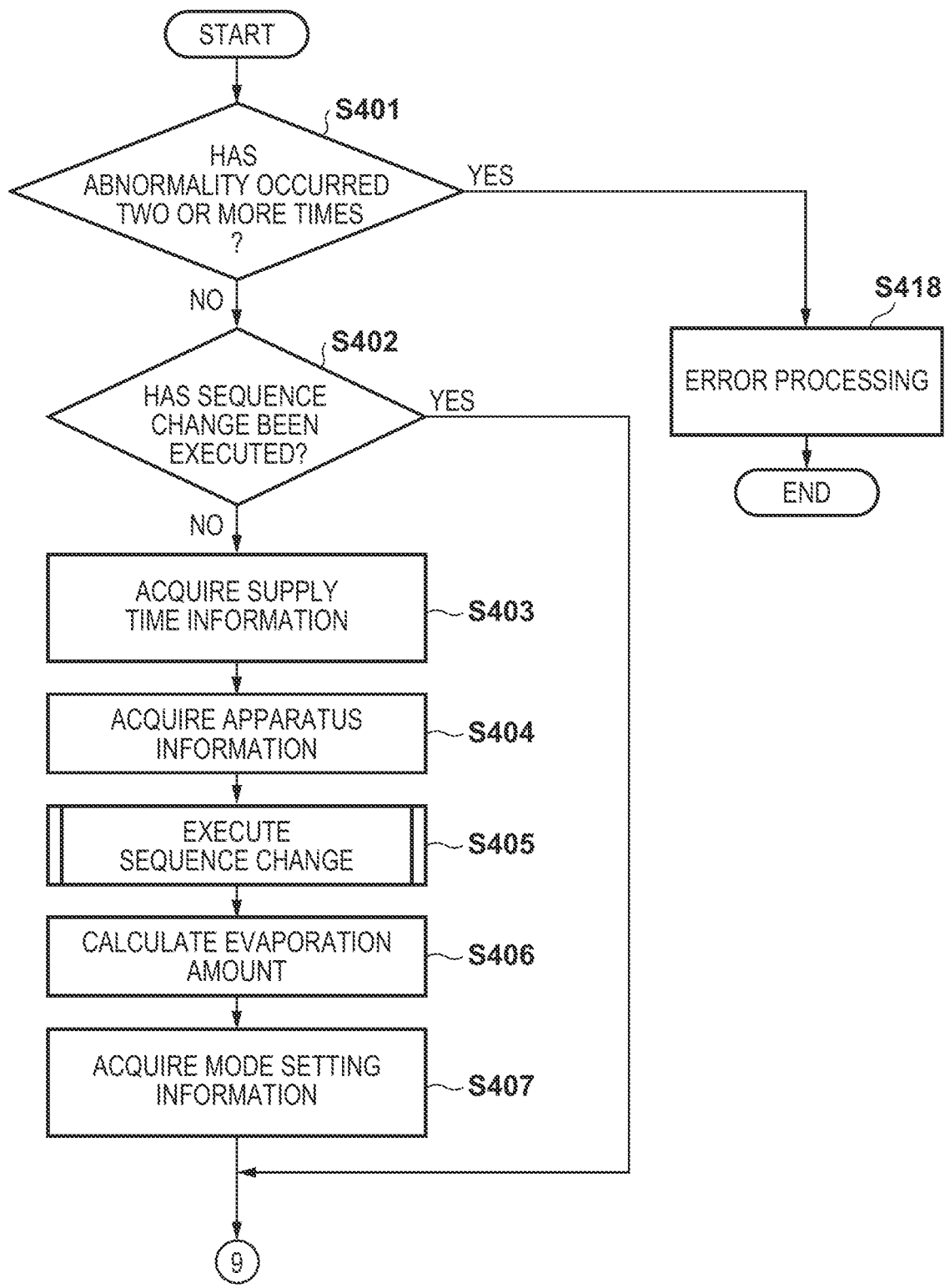
Figure 15:
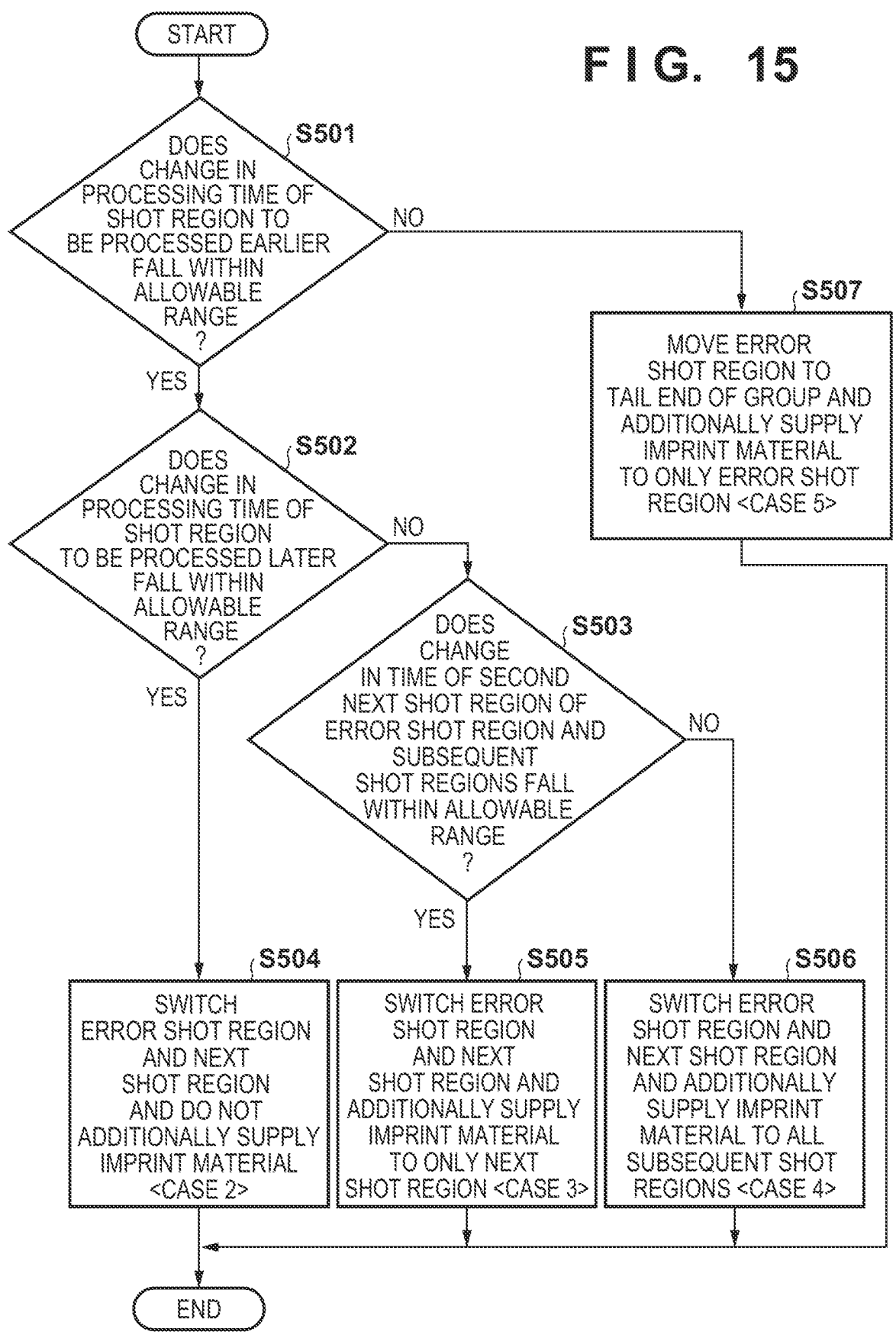
FIG. 15 is a flowchart showing an example of the operation of the imprint apparatus according to the second embodiment.

An imprint apparatus 100 according to the second embodiment of the present invention will be described below with reference to FIGS. 13 to 16. Note that matters not mentioned in the second embodiment can follow those in the first embodiment. FIGS. 13 to 15 show operation examples of the imprint apparatus 100 according to the second embodiment. The operation in each operation example is controlled by a controller 400. The processes of steps S101 to S107 and steps S110 to S116 in the operation example shown in FIGS. 13A and 13B are the same as those in the operation example of the first embodiment shown in FIG. 9.

In step S308, after step S107, it is determined whether the alignment measurement operation in step S107 has been completed normally. If it has been completed normally, the process advances to step S110. Otherwise (if an abnormality has occurred), the process advances to step S110 after step S309.

Step S309 will be described in detail with reference to FIGS. 14A and 14B. In step S401, it is determined whether an abnormality has occurred twice or more during the alignment measurement operation in step S107. If an abnormality has occurred twice or more, the process advances to step S418, and error processing is executed. The error processing in step S418 can include, for example, outputting an error message on the display of a user interface 34 and suspending the process. When the process is to be restarted from the suspended state, the operator can determine whether to take a measure to avoid the continued occurrence of abnormality or to halt the processing of the lot including the substrate which is being processed, and the operator can input the determination result in the user interface 34.

In step S402, it is determined whether step S405 (sequence change) has already been executed regarding the group which includes the current imprint process target shot region after the abnormality in the pre-contact alignment measuring operation had occurred. If step S405 has already been performed, the process advances to step S408. Otherwise, the process advances to step S403.

The elapsed time will change in a case where the processing order (sequence) of the plurality of shot regions forming the group is changed. For example, if the start time of the imprint process for a specific shot region is to be earlier than the start time which was set before the sequence change, the elapsed time with respect to the specific shot region will be shorter than the predetermined elapsed time. For example, in the example of FIG. 6A, the sequence has been defined in the processing recipe so that the imprint process will be executed in the order of shot number 24, 25, and 26. However, in a case in which the processing order of the shot region of shot number 25 and the shot region of shot number 26 is changed, the elapsed time with respect to the shot region of shot number 26 will become shorter than the predetermined elapsed time.

On the other hand, in a case in which the imprint process start time of a specific shot region after the sequence has been changed will be later than the imprint process start time set before the sequence change, the elapsed time regarding the specific shot region will be longer than the predetermined elapsed time.

Here, an example in which a sequence is changed for a group of shot regions of shot numbers 5 to 10 in FIG. 6B will be described with reference to FIG. 16. Reference symbols A to F denote the types of layout recipes associated with the shot regions and may be understood as representing the identifiers of the respective shot regions in FIG. 16. That is, the layout recipes A, B, C, D, E, and F correspond to shot numbers 5, 6, 7, 8, 9, and 10, respectively.

<Case 1>

In Case 1, there is no occurrence of an abnormality in the pre-contact alignment measurement operation (that is, the alignment measurement operation is successful) in all of the shot regions from shot number 5 to 10. In Case 1, the imprint process is performed in the order of shot number 5, 6, 7, 8, 9, and 10 (layout recipe A, B, C, D, E, and F).

Cases 2 to 6 are cases in which the sequence is changed due to the occurrence of an abnormality (failure of the alignment measurement operation) in the pre-contact alignment measurement operation for the shot region of shot number 6 (B).

<Case 2>

In Case 2, an abnormality occurs in the pre-contact alignment measurement operation for the shot region of shot number 6 (B), and the process on the shot region is suspended. Subsequently, in Case 2, the process advances to the pre-contact alignment measurement operation for the shot region of shot number 7 (C) that had been scheduled to undergo the imprint process next.

If the pre-contact alignment measurement operation for the shot region of shot number 7 (C) is successful, a time difference (t10–t11) between the time of that timing and the predetermined start time of the imprint process for the shot region of shot number 7 (C) is acquired. Next, it is determined whether the time difference (t10–t11) is within the time difference that can influence the imprint performance (that is, whether an influence due to a deficiency in the evaporation amount of the imprint material falls within an allowable range). Case 2 is a case in which it is determined that the time difference (t10–t11) falls within the allowable range.

The imprint process on the shot region of shot number 6 (B) is performed successively after the imprint process on the shot region of shot number 7 (C). If the imprint process excluding the pre-contact alignment measurement operation is executed on the shot region of shot number 6 (B), the difference (t10) between the execution start time and the predetermined start time of the imprint process on the shot region of shot number 6 (B) is acquired. Next, it is determined whether the time difference (t10) is within a time difference that can influence the imprint performance (that is, whether an influence due to an excessive evaporation amount of the imprint material falls within the allowable range). Case 2 is a case in which it is determined that this time difference (t10) falls within the allowable range, and the imprint process, excluding the pre-contact alignment measurement operation, is executed on the shot region of shot number 6 (B). As the result of the pre-contact alignment measurement operation on the shot region of shot number 6 (B), it is possible to use, for example, the average value of the results from the pre-contact alignment measurement operation on the shot region of shot number 5 (A) and the shot region of shot number 7 (C).

<Case 3>

In Case 3, after the sequence change, the time difference regarding the shot region of shot number 7 (C) falls within the allowable range. Also, in Case 3, the time difference regarding the shot region of shot number 6 (B) falls outside the allowable range, and the time differences for the shot regions of shot numbers 8 (D), 9 (E), and 10 (F) fall within the allowable range. Here, the time difference acquired for each shot region is the time difference between the start time of the imprint process on the shot region after the sequence change and the predetermined start time of the imprint process on the shot region before the sequence change.

<Case 4>

In Case 4, the time difference for the shot region of shot number 7 (C) falls within the allowable range. Also, in Case 4, the time differences for the shot regions of shot numbers 6 (B), 8 (D), 9 (E), and 10 (F) fall outside the allowable range. In Case 4, the imprint material is additionally supplied to the shot regions of shot numbers 6 (B) to 10 (F). In Case 4, time t13 is the time required for the additionally supplying the imprint material to the shot regions of shot numbers 6 (B) to 10 (F).

<Case 5>

In Case 5, after the sequence change, the time difference for the shot region of shot number 7 (C) falls outside the allowable range. Also, in Case 5, the start of the imprint process is put on hold from the time at which the pre-contact alignment measurement operation has been determined to be successful until it falls within the allowable range of the predetermined start time of the imprint process on the shot region of shot number 7 (C). FIG. 16 shows an example in which the start of continuous imprint process is put on hold from the time at which the pre-contact alignment measurement operation has been determined to be successful until the predetermined start time of the imprint process on the shot region of shot number 7 (C). After the imprint process on the shot region of shot number 7 (C) is completed, the imprint process is executed on the shot regions of shot numbers 8 (D), 9 (E), and 10 (F). Finally, the additional imprint material is supplied to the shot region of shot number 6 (B). This addition process requires time t12. Subsequently, the imprint process is executed on the shot region of shot number 6 (B).

<Case 6>

In Case 6, after the completion of the imprint process on the shot region of shot number 7, the imprint material is additionally supplied to the shot regions of shot numbers 6 (B), 8 (D), 9 (E), and 10 (F), and the imprint process is executed in accordance with this order. Time t13 is required to additionally supply the imprint material to the shot regions of shot numbers 6 (B), 8 (D), 9 (E), and 10 (F).

As described with respect to Case 2, in a case in which the pre-contact alignment measurement operation for a given shot region has failed, the result from the pre-contact alignment measurement operation that has been already executed for a shot region adjacent to the given shot region can be used. However, there may be a case in which the pre-contact alignment measurement operation for a given shot region has failed but the pre-contact alignment measurement operation has not yet been performed for the shot region adjacent to the given shot region. In such a case, it is possible to use the result from the pre-contact alignment measurement operation of another shot region that has already undergone the pre-contact alignment process.

The explanation will continue by returning to FIGS. 14A and 14B hereinafter. In step S403, the controller 400 extracts, based on the supply time information and the shot number information stored in step S106, the supply time information indicating the time at which the imprint material was supplied to the imprint process target shot region. In step S404, the controller 400 acquires apparatus information such as the time required for the pre-contact alignment process, the time required to move the shot region from the position below the mold 18 to the position below the dispenser 23, the time required to arrange the imprint material on the shot region, and the like.

In step S405, the controller 400 executes the sequence change based on the evaporation residual ratio, the evaporation amount, pieces of information acquired in steps S403 and S404, and the like. The sequence change (step S405) will be described in detail with reference to FIG. 15.

In step S501, in a case where a shot region (to be referred to as an error shot region hereinafter) in which an abnormality has occurred in the pre-contact alignment measurement operation and its succeeding shot region are switched, the controller 400 determines whether the change to the processing time of a shot region whose processing order has been made earlier falls within the allowable range. This determination can be made by comparing, based on the change to the start time of the imprint process on the shot region to be processed earlier, the amount of the imprint material at the contact timing of the mold 18 to the imprint material with a preset threshold. In other words, it is determined whether the influence due to the evaporation amount of the imprint material being less than the predetermined evaporation amount falls within an allowable range. If the result of the change to the start time of the imprint process on the shot region to be processed earlier falls within the allowable range, the process advances to step S502. Otherwise, the process advances to step S507.

In step S502, in a case where the order of the error shot region and the next shot region is switched, the controller 400 determines whether the change to the process time of the shot region (the error shot region) whose processing order has been made later falls within an allowable range. This determination can be made by comparing, based on the change in the start time of the imprint process on the shot region to be processed later, the amount of the imprint material at the contact timing of the mold 18 to the imprint material with a predetermined threshold. In other words, it is determined whether the influence due to the evaporation amount of the imprint material being more than the predetermined evaporation amount falls within an allowable range. If the result of the change to the start time of the imprint process on the shot region to be processed later falls within the allowable range, the process advances to step S504. Otherwise, the process advances to step S503.

In step S503, the controller 400 determines whether the change in the processing time of a second next shot region of the error shot region and that of a third next shot region will fall within the allowable range. This determination can be performed by comparing, based on the change in the start time of the imprint process on the second next shot region of the error shot region and that of the third next shot region, the amount of the imprint material at the contact timing of the mold 18 to the imprint material with a preset threshold. If the start time of the imprint process on the second next shot region of the error shot region and that of the third next shot region fall within the allowable range, the process advances to step S505. Otherwise, the process advances to step S506.

In step S503, the controller 400 changes the sequence to switch the error shot region and the next shot region and determines, in accordance with the switch, not to additionally supply the imprint material. In step S505, the controller 400 changes the sequence to switch the error shot region and the next shot region. In step S505, the controller 400 also determines, in accordance with the switch, so that the imprint material will be additionally supplied to the shot region (the error shot region) which is to undergo the imprint process next.

In step S506, the controller 400 changes the sequence to switch the error shot region and the next shot region and determines, in accordance with the switch, to additionally supply the imprint material to the next shot region and to all of the following shot regions. In step S507, the controller 400 changes the sequence so that error shot region will be the last shot region to undergo the imprint process in the group and determines, in accordance with this switching, so that the imprint material will be additionally supplied to only the error shot region.

The explanation will continue by returning to FIGS. 14A and 14B hereinafter. In step S406, after step S405, based on the preset evaporation characteristic and an excess time which is the difference between the predetermined start time and the start time of the imprint process after the sequence change, the adjuster 405 determines the evaporation amount of the imprint material in the excess time. In step S206, the adjuster 405 acquires an imprint material addition mode set in the processing recipe. The imprint material addition mode can include a first mode and a second mode in the same manner as that in the first embodiment.

In step S408, the controller 400 determines, based on the determination of step S405, whether the imprint material needs to be additionally supplied. If the imprint material needs to be additionally supplied, the process advances to step S207. Otherwise, the process advances to step S415. The processes of step S207 and its subsequent steps are the same as those in the first embodiment. In step S415, the controller 400 determines whether the contact timing of the mold 18 with the imprint material on the imprint process target shot region needs to be delayed. If the timing needs to be delayed, the process advances to step S416. In step S416, the adjuster 405 executes, as the adjustment processing, processing to delay the contact timing of the mold 18 with the imprint material for an amount of time corresponding to the difference between the predetermined elapsed time and the elapsed time.

A pattern of a cured product formed by using an imprint apparatus is used permanently for at least some of various articles or used temporarily when the various articles are manufactured. The article includes an electric circuit element, an optical element, a MEMS, a recording element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes an imprint mold or the like.

The pattern of the cured product is used intact as a constituent member of at least a part of the above-described article or used temporarily as a resist mask. The resist mask is removed after etching, ion implantation, or the like is performed in a processing step of the substrate.

Figure 17A:
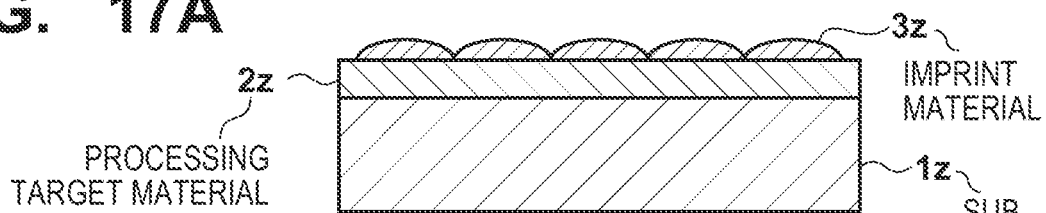
FIGS. 17A to 17F are views showing a method of manufacturing an article.

An article manufacturing method of forming a pattern on a substrate by an imprint apparatus, processing the substrate on which the pattern has been formed, and manufacturing an article from the substrate on which the process has been performed will be described next. As shown in FIG. 17A, a substrate $1z$ such as a silicon wafer having a processing target material $2z$ such as an insulator formed on its surface is prepared, and then an imprint material $3z$ is applied on the surface of the processing target material $2z$ by an inkjet method or the like. A state is shown here in which the imprint material $3z$ formed into a plurality of droplets is applied on the substrate.

Figure 17B:
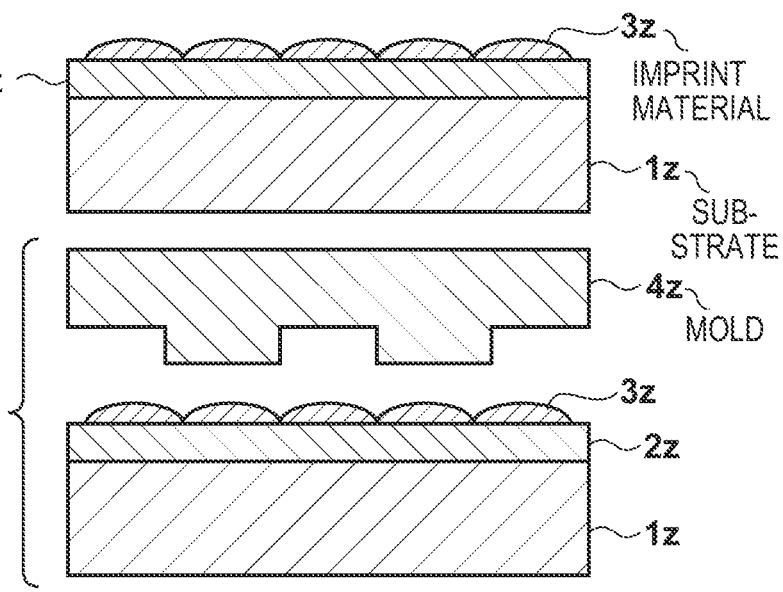
Figure 17C:
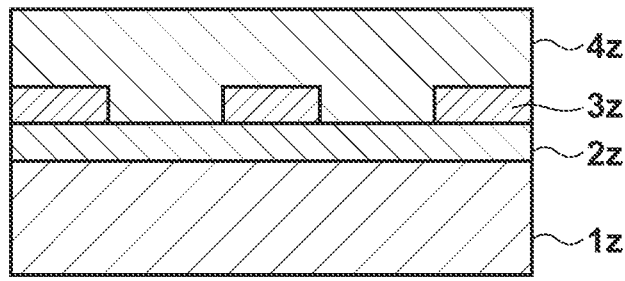

As shown in FIG. 17B, a side of an imprinting mold $4z$ on which its three-dimensional pattern is formed is caused to face the imprint material $3z$ on the substrate. As shown in FIG. 17C, a mold $4z$ and the substrate $1z$ to which the imprint material $3z$ is applied are brought into contact with each other, and a pressure is applied. The imprint material $3z$ fills the gap between the mold $4z$ and the processing target material $2z$. The imprint material $3z$ is cured by irradiating it with light as curing energy through the mold $4z$ in this state.

Figure 17D:
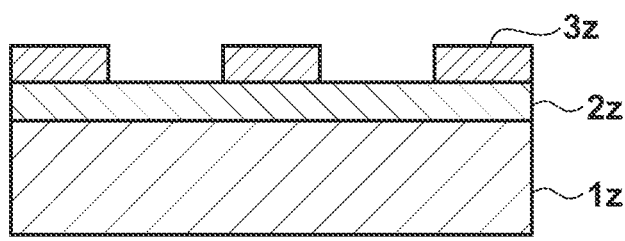

As shown in of FIG. 17D, the pattern of the cured product of the imprint material $3z$ is formed on the substrate $1z$ by releasing the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 17E:
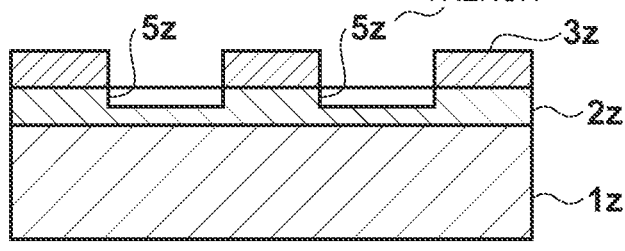
Figure 17F:
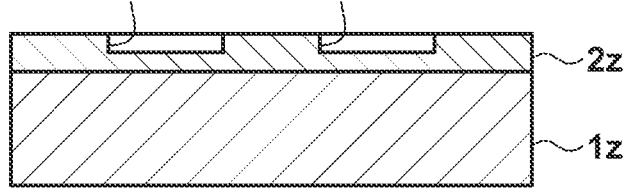

As shown in of FIG. 17E, out of the surface of the processing target material $2z$, portions without any cured product or portions where the cured products remain thin are removed and become trenches $5z$ by performing etching using the pattern of the cured product as an etching resistant mask. As shown in FIG. 17F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-179006, filed Sep. 19, 2017, which is hereby incorporated by reference herein in its entirety.

What is claimed is:

1. An imprint apparatus that performs an imprint process by bringing a mold into contact with an imprint material arranged on a shot region of a substrate and curing the imprint material, the apparatus comprising:
a controller configured to:
obtain a predetermined elapsed time corresponding to an amount of elapsed time from a supplying of an imprint material to a shot region until a contact with a mold;
obtain an amount of time that will actually elapse from the supplying of the imprint material to the shot region until an expected contact with the mold;
determine whether the amount of time that will actually elapse from the supplying of the imprint material to the shot region until the expected contact with the mold falls outside an allowable range of the predetermined elapsed time; and
execute, in a case where it is determined that the amount of time that will actually elapse from the supplying of the imprint material to the shot region until the expected contact with the mold falls outside the allowable range of the predetermined elapsed time, adjustment processing such that an amount of the imprint material on the shot region is adjusted before the mold and the imprint material are brought into contact.

2. The apparatus according to claim 1, wherein the controller comprises:
a first calculator configured to calculate the predetermined elapsed time based on control information for controlling the supplying of the imprint material to the substrate and the imprint process,
a second calculator configured to calculate, after the imprint material is supplied to the shot region, the amount of time that will actually elapse from the supplying of the imprint material to the shot region until the expected contact with the mold, and
an adjuster configured to execute the adjustment processing in the case where it is determined that the amount of time that will actually elapse from the supplying of the imprint material to the shot region until the expected contact with the mold falls outside the allowable range of the predetermined elapsed time.

3. The apparatus according to claim 2, wherein in a case where it is determined that the amount of time that will actually elapse from the supplying of the imprint material to the shot region until the expected contact with the mold falls outside the allowable range of the predetermined elapsed time by being shorter than the predetermined elapsed time, the adjuster delays a timing of the contact of the imprint material with the mold.

4. The apparatus according to claim 3, wherein in a case where an order of the imprint process on a plurality of shot regions of the substrate is changed, the calculation by the second calculator and the adjustment processing by the adjuster are executed.

5. The apparatus according to claim 3, wherein in a case where the imprint process on at least one of a plurality of shot regions, in which the imprint material is arranged, on the substrate is skipped, the calculation by the second calculator and the adjustment processing by the adjuster are executed.

6. The apparatus according to claim 2, further comprising:
a dispenser configured to supply the imprint material onto the shot region,
wherein in a case where it is determined that the amount of time that will actually elapse from the supplying of the imprint material to the shot region until the expected contact with the mold falls outside the allowable range of the predetermined elapsed time by being longer than the predetermined elapsed time, the adjuster executes, as the adjustment processing, processing to control the dispenser so as to supply additional imprint material to the shot region.

7. The apparatus according to claim 6, wherein in the case where the additional imprint material is to be supplied to the shot region, the adjuster controls the dispenser so as to supply the additional imprint material to the same position as a position of the imprint material already arranged on the shot region.

8. The apparatus according to claim 6, wherein in the case where the additional imprint material is to be supplied to the shot region, the adjuster controls the dispenser so as to supply the additional imprint material to a position different from a position of the imprint material already arranged on the shot region.

9. An imprint apparatus that performs an imprint process of bringing a mold into contact with an imprint material arranged on a substrate and curing the imprint material, comprising:
a dispenser configured to discharge the imprint material; and
a controller configured to;
control the dispenser so that the imprint material is arranged in an imprint material supply target shot region on the substrate in accordance with a layout recipe associated with the imprint material supply target shot region;
obtain a predetermined elapsed time corresponding to an amount of elapsed time from a supplying of the imprint material to the imprint material supply target shot region until a contact with the mold;
obtain an amount of time that will actually elapse from the supplying of the imprint material to the imprint material supply target shot region until an expected contact with the mold; and
determine whether the amount of time that will actually elapse from the supplying of the imprint material to the imprint material supply target shot region until the expected contact with the mold falls outside an allowable range of the predetermined elapsed time,
wherein the controller determines, based on the determination of whether the amount of time that will actually elapse from the supplying of the imprint material to the imprint material supply target shot region until the expected contact with the mold falls outside the allowable range of the predetermined elapsed time, whether the layout recipe is appropriate and executes error processing in a case where the layout recipe is determined to be inappropriate.

10. A manufacturing method comprising:
forming a pattern on a substrate by an imprint process of bringing a mold into contact with an imprint material arranged on a shot region of the substrate and curing the imprint material, wherein the forming of the pattern comprises:
obtaining a predetermined elapsed time corresponding to an amount of elapsed time from a supplying of an imprint material to a shot region until a contact with a mold, obtaining an amount of time that will actually elapse from the supplying of the imprint material to the shot region until an expected contact with the mold, determining whether the amount of time that will actually elapse from the supplying of the imprint material to the shot region until the expected contact with the mold falls outside an allowable range of the predetermined elapsed time, and executing, in a case in which it is determined that the amount of time that will actually elapse from the supplying of the imprint material to the shot region until the expected contact with the mold falls outside the allowable range of the predetermined elapsed time, adjustment processing such that an amount of the imprint material on the shot region is adjusted before the mold and the imprint material are brought into contact; and processing the substrate on which the pattern has been formed, wherein an article is manufactured from the processed substrate.

11. A manufacturing method comprising:

forming a pattern on a substrate by an imprint process of bringing a mold into contact with an imprint material arranged on a shot region of the substrate and curing the imprint material, wherein the forming of the pattern comprises:

controlling a dispenser, which is configured to discharge the imprint material, so that the imprint material is arranged in an imprint material supply target shot region on the substrate in accordance with a layout recipe associated with the imprint material supply target shot region, obtaining a predetermined elapsed time corresponding to an amount of elapsed time from a supplying of the imprint material to the imprint material supply target shot region until a contact with the mold, obtaining an amount of time that will actually elapse from the supplying of the imprint material to the imprint material supply target shot region until an expected contact with the mold, determining whether the amount of time that will actually elapse from the supplying of the imprint material to the imprint material supply target shot region until the expected contact with the mold falls outside an allowable range of the predetermined elapsed time, and determining, based on the determination of whether the amount of time that will actually elapse from the supplying of the imprint material to the imprint material supply target shot region until the expected contact with the mold falls outside the allowable range of the predetermined elapsed time, whether the layout recipe is appropriate and executing error processing in a case where the layout recipe is determined to be inappropriate; and processing the substrate on which the pattern has been formed, wherein an article is manufactured from the processed substrate.

* * * * *